(12) United States Patent
Takeshita et al.

(10) Patent No.: US 10,916,557 B2
(45) Date of Patent: Feb. 9, 2021

(54) SEMICONDUCTOR DEVICE

(71) Applicant: Toshiba Memory Corporation, Minato-ku (JP)

(72) Inventors: Shunpei Takeshita, Yokkaichi (JP); Namiki Yoshikawa, Suzuka (JP); Kazuhide Takamura, Yokkaichi (JP); Naoki Yamamoto, Kuwana (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/123,148

(22) Filed: Sep. 6, 2018

(65) Prior Publication Data
US 2019/0348431 A1 Nov. 14, 2019

(30) Foreign Application Priority Data
May 14, 2018 (JP) .................................. 2018-092888

(51) Int. Cl.
*H01L 27/11582* (2017.01)
*H01L 29/423* (2006.01)
*H01L 27/1157* (2017.01)
*H01L 29/792* (2006.01)
*H01L 27/11556* (2017.01)
*H01L 27/11524* (2017.01)

(52) U.S. Cl.
CPC .... *H01L 27/11582* (2013.01); *H01L 27/1157* (2013.01); *H01L 29/4234* (2013.01); *H01L 27/11524* (2013.01); *H01L 27/11556* (2013.01); *H01L 29/7926* (2013.01)

(58) Field of Classification Search
CPC ......... H01L 27/11582; H01L 27/11556; H01L 27/11563; H01L 27/11578; H01L 29/4234; H01L 23/52; H01L 27/0688
See application file for complete search history.

(56) References Cited

U.S. PATENT DOCUMENTS

| 9,331,082 | B2 | 5/2016 | Lee et al. |
| 9,356,038 | B2 | 5/2016 | Lee et al. |
| 9,449,870 | B2 | 9/2016 | Eun et al. |
| 9,558,945 | B2 * | 1/2017 | Fukuzumi .......... H01L 27/11568 |
| 10,074,667 | B1 * | 9/2018 | Higashi ............... H01L 25/0657 |
| 2009/0230449 | A1 * | 9/2009 | Sakaguchi ........ H01L 27/11575 257/298 |

(Continued)

*Primary Examiner* — Wael M Fahmy
*Assistant Examiner* — Sarah K Salerno
(74) *Attorney, Agent, or Firm* — Oblon, McClelland, Maier & Neustadt, L.L.P.

(57) ABSTRACT

According to one embodiment, the first electrode layer includes a first portion and a second portion thicker than the first portion. The second electrode layer includes a third portion and a fourth portion thicker than the third portion. The fourth portion is provided on a lower level side of the second portion. The fourth portion has a level difference in a staircase configuration between the fourth portion and the second portion. The fourth portion protrudes along a first direction further than an edge of the second portion. The third electrode layer is provided between the first electrode layer and the third portion. The third electrode layer has an edge receding further than the edge of the second portion of the first electrode layer. The receding is in a reverse direction of a protruding direction of the fourth portion of the second electrode layer.

20 Claims, 24 Drawing Sheets

(56) References Cited

U.S. PATENT DOCUMENTS

| | | | |
|---|---|---|---|
| 2014/0027838 A1 | 1/2014 | Kido et al. | |
| 2014/0183756 A1* | 7/2014 | Hwang | H01L 27/11556 |
| | | | 257/774 |
| 2016/0268278 A1* | 9/2016 | Kono | H01L 27/1157 |
| 2017/0047334 A1 | 2/2017 | Lu et al. | |
| 2017/0084532 A1 | 3/2017 | Son et al. | |
| 2017/0148812 A1* | 5/2017 | Hsu | H01L 27/11568 |
| 2017/0194255 A1* | 7/2017 | Oh | H01L 21/76816 |
| 2017/0271256 A1 | 9/2017 | Inatsuka | |
| 2018/0026046 A1* | 1/2018 | Nam | H01L 27/1157 |
| | | | 257/314 |
| 2018/0076214 A1* | 3/2018 | Lim | H01L 23/528 |
| 2018/0261575 A1* | 9/2018 | Tagami | H01L 27/1157 |

\* cited by examiner

SEMICONDUCTOR DEVICE

CROSS-REFERENCE TO RELATED APPLICATION

This application is based upon and claims the benefit of priority from Japanese Patent Application No. 2018-092888, filed on May 14, 2018; the entire contents of which are incorporated herein by reference.

FIELD

Embodiments described herein relate generally to a semiconductor device.

BACKGROUND

A structure of a three-dimensional memory device is known in which film thicknesses are increased for terrace portions of multiple electrode layers stacked in a staircase configuration.

DETAILED DESCRIPTION

Figure 1:
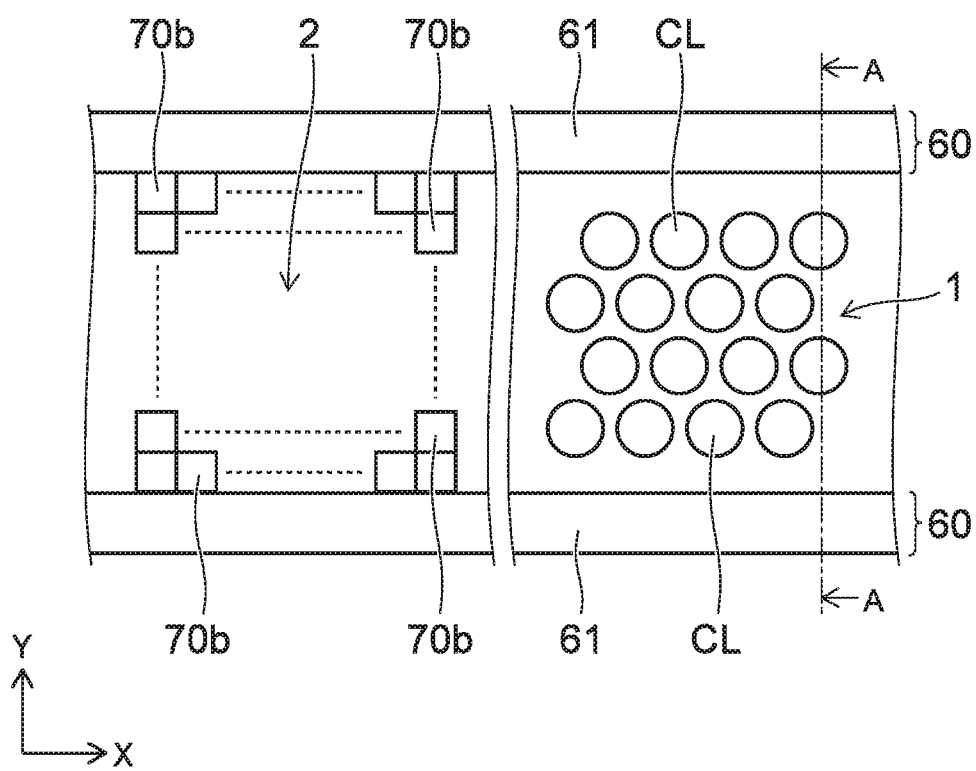
FIG. 1 is a schematic plan view of a semiconductor device of an embodiment.

According to one embodiment, a semiconductor device includes a stacked body including a plurality of electrode layers stacked with an insulator interposed. The plurality of electrode layers include a first electrode layer, a second electrode layer, and a third electrode layer. The first electrode layer includes a first portion and a second portion thicker than the first portion. The second electrode layer includes a third portion and a fourth portion thicker than the third portion. The fourth portion is provided on a lower level side of the second portion of the first electrode layer. The fourth portion has a level difference in a staircase configuration between the fourth portion and the second portion. The fourth portion protrudes along a first direction further than an edge of the second portion. The third electrode layer is provided between the first electrode layer and the third portion of the second electrode layer. The third electrode layer has an edge receding further than the edge of the second portion of the first electrode layer. The receding is in a reverse direction of a protruding direction of the fourth portion of the second electrode layer.

An embodiment will now be described with reference to the drawings. The same components in the drawings are marked with the same reference numerals.

In the embodiment, for example, a semiconductor memory device that includes a memory cell array having a three-dimensional structure is described as a semiconductor device.

FIG. 1 is a schematic plan view of the semiconductor device of the embodiment.

The semiconductor device of the embodiment includes a memory cell array 1, and a staircase portion 2 provided in a peripheral region on the outer side of the memory cell array 1. The memory cell array 1 and the staircase portion 2 are provided on the same substrate.

Figure 2:
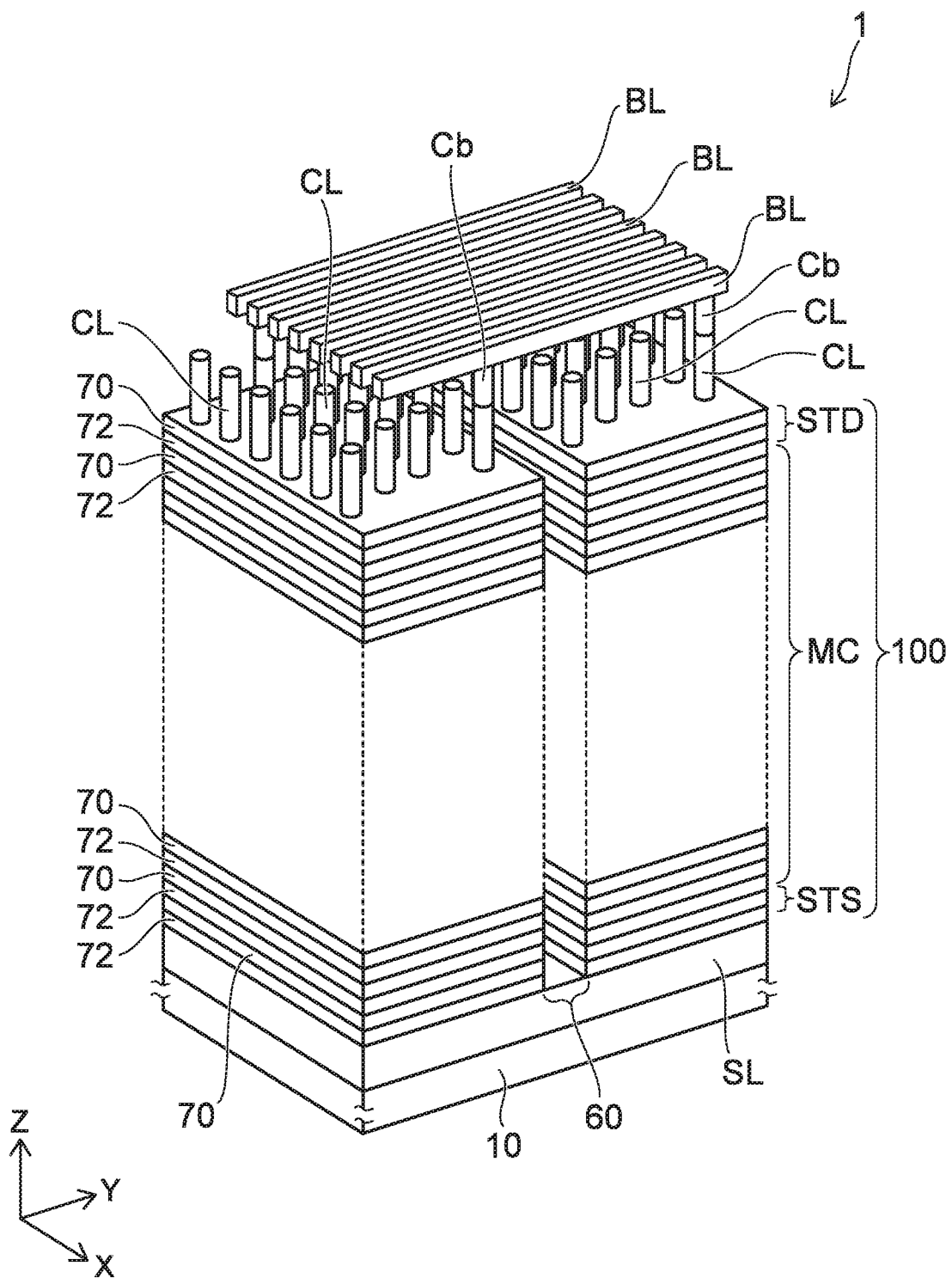
FIG. 2 is a schematic perspective view of a memory cell array of the semiconductor device of the embodiment.

FIG. 2 is a schematic perspective view of the memory cell array 1.

Figure 3:
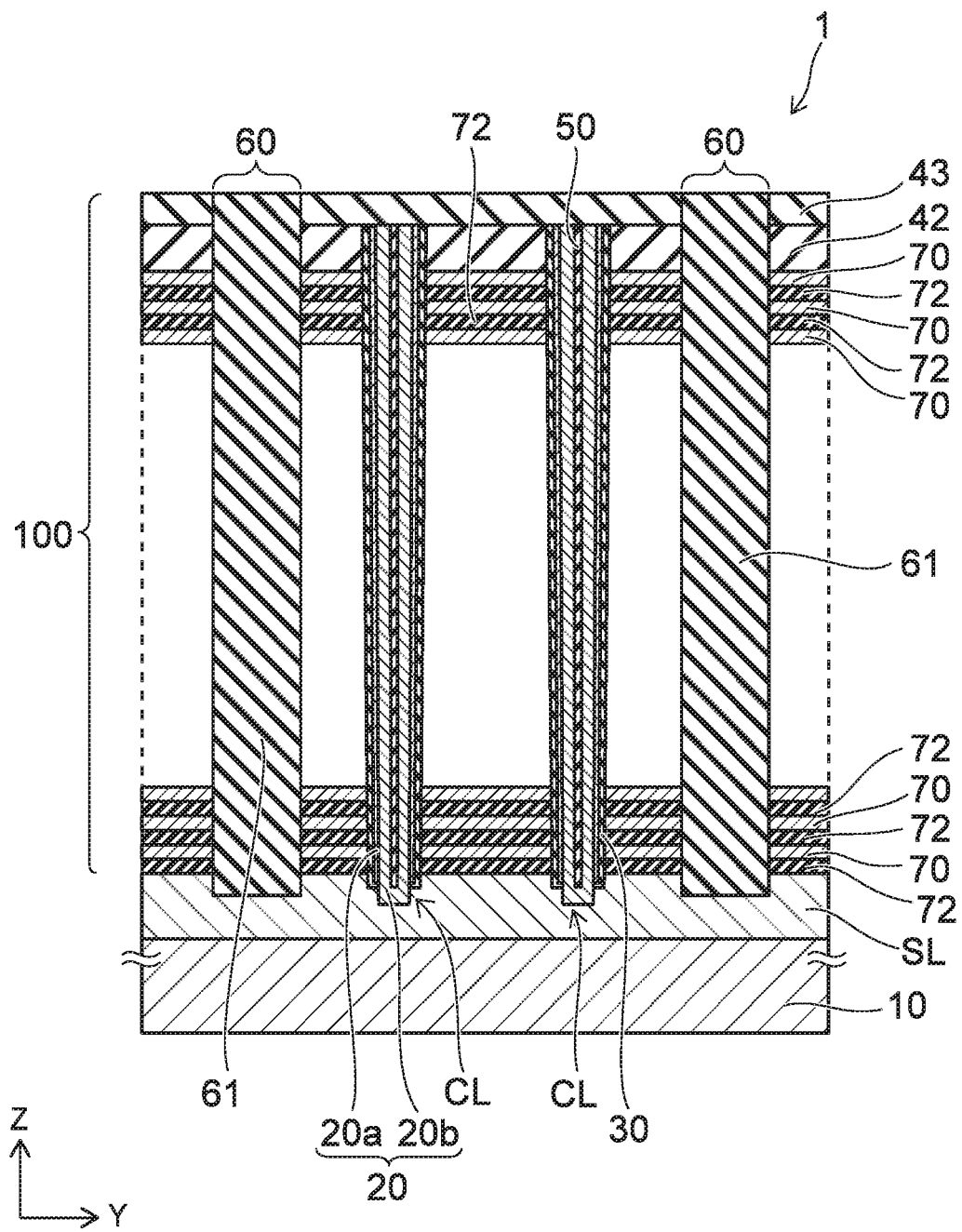
FIG. 3 is an A-A cross-sectional view of FIG. 1.

FIG. 3 is an A-A cross-sectional view of FIG. 1.

In FIG. 2, two mutually-orthogonal directions parallel to a major surface of a substrate 10 are taken as an X-direction and a Y-direction; and a direction orthogonal to both the X-direction and the Y-direction is taken as a Z-direction. The X-direction, the Y-direction, and the Z-direction shown in the other drawings correspond respectively to the X-direction, the Y-direction, and the Z-direction of FIG. 2.

The memory cell array 1 includes the substrate 10, a stacked body 100, a source layer SL provided between the substrate 10 and the stacked body 100, multiple columnar portions CL, and multiple bit lines BL provided above the stacked body 100.

The substrate 10 is, for example, a silicon substrate. The source layer SL includes a semiconductor layer doped with an impurity and may further include a layer including a metal. An insulating layer may be provided between the substrate 10 and the source layer SL.

Multiple separation portions 60 are provided in the stacked body 100. The separation portions 60 extend along the Z-direction and reach the source layer SL. The separation portions 60 also extend along the X-direction, and divide the stacked body 100 into multiple blocks in the Y-direction. The separation portions 60 are formed from insulating films 61 as shown in FIG. 3.

The columnar portions CL are formed in substantially circular columnar configurations extending through the stacked body 100 in the Z-direction. For example, the multiple columnar portions CL have a staggered arrangement. Or, the multiple columnar portions CL may be arranged in a square lattice along the X-direction and the Y-direction.

The multiple bit lines BL extend along the Y-direction and are, for example, metal films. The multiple bit lines BL are separated from each other in the X-direction. The upper end portions of semiconductor bodies 20 of the columnar portions CL described below are connected to the bit lines BL via contacts Cb shown in FIG. 2.

The stacked body 100 includes multiple electrode layers 70 stacked in a direction (the Z-direction) perpendicular to the major surface of the substrate 10. The multiple electrode layers 70 are stacked in the Z-direction with insulating layers (insulators) 72 interposed. The electrode layers 70 are, for example, metal layers. The electrode layers 70 include, for example, tungsten or molybdenum as a major component.

The insulator between the electrode layers 70 may be an air gap. The insulating layer 72 is provided also between the source layer SL and the electrode layer 70 of the lowermost layer.

An insulating film 42 is provided on the electrode layer 70 of the uppermost layer; and an insulating film 43 is provided on the insulating film 42. The insulating film 43 covers the upper ends of the columnar portions CL. The columnar portions CL pierce the multiple electrode layers 70 and the multiple insulating layers 72, and reach the source layer SL.

Figure 4:
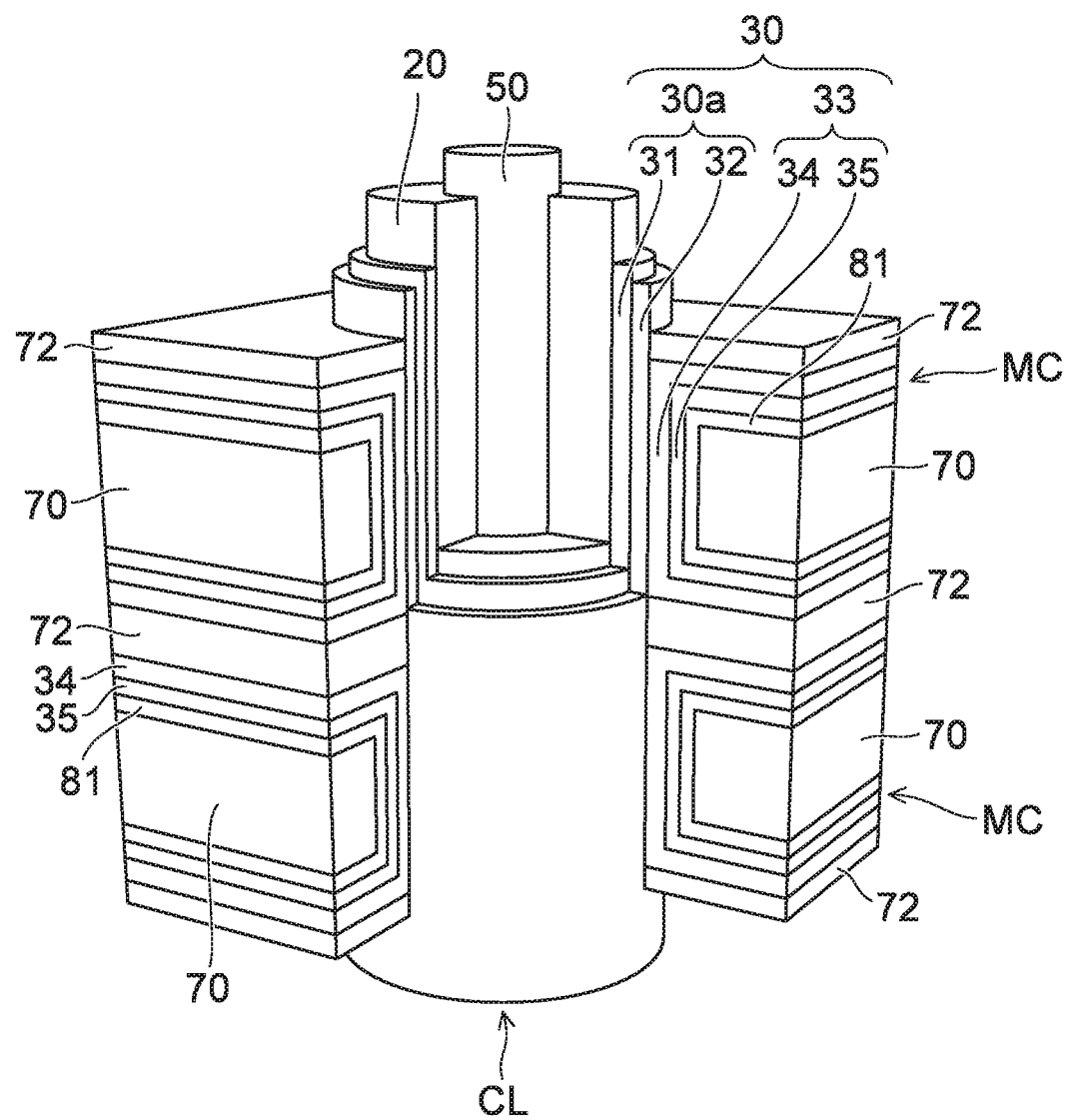
FIG. 4 is a schematic cross-sectional perspective view of a memory cell of the embodiment.

FIG. 4 is a schematic cross-sectional perspective view of memory cells MC of the embodiment.

The columnar portion CL includes a memory film 30, the semiconductor body 20, and an insulative core film 50. The semiconductor body 20 is formed in a pipe-like configuration; and the core film 50 is provided on the inner side of the semiconductor body 20. The memory film 30 is provided between the electrode layer 70 and the semiconductor body 20, and surrounds the periphery of the semiconductor body 20.

The semiconductor body 20 is, for example, a silicon film; and the lower end portion of the semiconductor body 20 contacts the source layer SL. The upper end portion of the semiconductor body 20 is connected to the bit line BL via the contact Cb shown in FIG. 2.

The memory film 30 is a stacked film including a tunneling insulating film 31, a charge storage film (a charge storage portion) 32, and a blocking insulating film 33. The blocking insulating film 33, the charge storage film 32, and the tunneling insulating film 31 are provided between the electrode layer 70 and the semiconductor body 20 in order from the electrode layer 70 side.

The semiconductor body 20, the memory film 30, and the electrode layer 70 are included in the memory cell MC. The memory cell MC has a vertical transistor structure in which the electrode layer 70 surrounds the periphery of the semiconductor body 20 with the memory film 30 interposed.

In the memory cell MC having the vertical transistor structure, the semiconductor body 20 functions as a channel; and the electrode layer 70 functions as a control gate. The charge storage film 32 functions as a data storage layer that stores charge injected from the semiconductor body 20.

The semiconductor memory device of the embodiment is a nonvolatile semiconductor memory device that can freely and electrically erase/program data and can retain the memory content even when the power supply is OFF.

The memory cell MC is, for example, a charge trap memory cell. The charge storage film 32 has many trap sites that trap charge inside an insulative film. The charge storage film 32 includes, for example, a silicon nitride film. Or, the charge storage portion may be a conductive floating gate surrounded with an insulator.

The tunneling insulating film 31 is used as a potential barrier when the charge is injected from the semiconductor body 20 into the charge storage film 32 or when the charge that is stored in the charge storage film 32 is discharged into the semiconductor body 20. The tunneling insulating film 31 includes, for example, a silicon oxide film.

The blocking insulating film 33 prevents the charge stored in the charge storage film 32 from being discharged into the electrode layer 70. Also, the blocking insulating film 33 prevents back-tunneling of the charge from the electrode layer 70 into the columnar portion CL.

The blocking insulating film 33 includes a first blocking film 34 and a second blocking film 35. The first blocking film 34 is, for example, a silicon oxide film; and the second blocking film 35 is, for example, a metal oxide film. The first blocking film 34 is provided between the charge storage film 32 and the second blocking film 35; and the second blocking film 35 is provided between the first blocking film 34 and the electrode layer 70.

As shown in FIG. 2, a drain-side select transistor STD is provided in the upper layer portion of the stacked body 100; and a source-side select transistor STS is provided in the lower layer portion of the stacked body 100.

Among the multiple electrode layers 70, it is possible for the electrode layer 70 of at least the uppermost layer to function as a control gate (a drain-side select gate) of the drain-side select transistor STD; and it is possible for the electrode layer 70 of at least the lowermost layer to function as a control gate (a source-side select gate) of the source-side select transistor STS.

The multiple memory cells MC are provided between the drain-side select transistor STD and the source-side select transistor STS. The multiple memory cells MC, the drain-side select transistor STD, and the source-side select transistor STS are connected in series via the semiconductor body 20 of the columnar portion CL. The multiple memory cells MC are provided three-dimensionally in the X-direction, the Y-direction, and the Z-direction.

As shown in FIG. 1, the stacked body 100 and the separation portions 60 extend along the X-direction from a region including the memory cell array 1 to a region including the staircase portion 2.

The staircase portion 2 is provided in a portion of the stacked body 100 positioned further on the outer side than the memory cell array 1. In the staircase portion 2, the multiple electrode layers 70 include multiple terrace portions 70b arranged in a staircase configuration to form level differences along the X-direction and level differences along the Y-direction.

Figure 5:
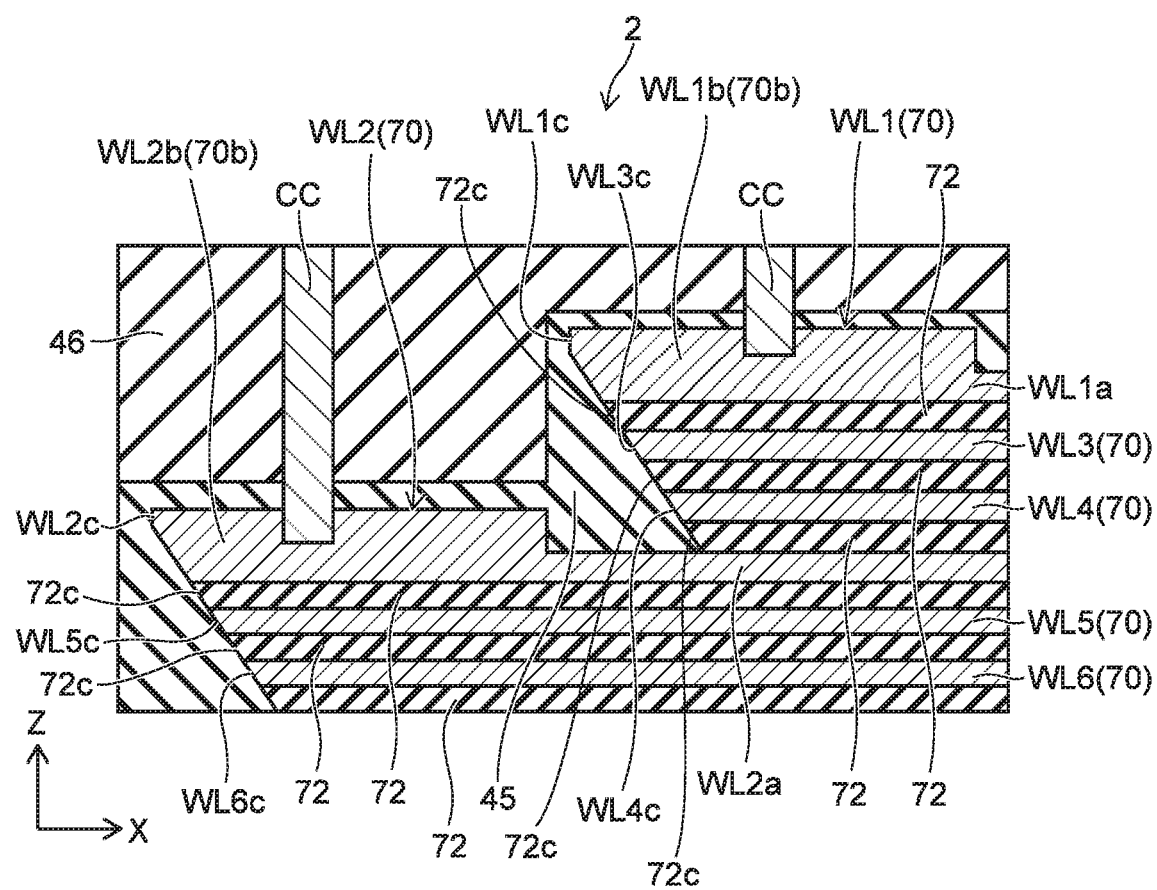
FIG. 5 is a schematic cross-sectional view of a staircase portion of the semiconductor device of the embodiment.

FIG. 5 is a schematic cross-sectional view of the staircase portion 2.

FIG. 5 illustrates a portion of the multiple electrode layers 70 in which six arbitrary layers of electrode layers WL1, WL2, WL3, WL4, WL5, and WL6 are stacked. The electrode layers WL1, WL2, WL3, WL4, WL5, and WL6 function as control gates of the memory cells MC. FIG. 5 illustrates a cross section where a terrace portion WL1b of the electrode layer WL1 and a terrace portion WL2b of the electrode layer WL2 form a level-difference portion along the X-direction. The memory cell array 1 is provided in the region of FIG. 5 extending in the right direction.

One or more layers of other electrode layers WL3 and WL4 are provided between the electrode layer WL1 and the electrode layer WL2 respectively including the terrace portions WL1b and WL2b forming one step. One or more layers of other electrode layers WL5 and WL6 are provided between the electrode layer WL2 and an electrode layer (not illustrated) including another terrace portion (not illustrated) in a level lower than the terrace portion WL2b.

The electrode layer WL3 is provided under the electrode layer WL1; the electrode layer WL4 is provided under the electrode layer WL3; the electrode layer WL2 is provided under the electrode layer WL4; the electrode layer WL5 is provided under the electrode layer WL2; and the electrode layer WL6 is provided under the electrode layer WL5. The insulating layers 72 are provided respectively between the electrode layers WL1 to WL6.

The electrode layer WL1 includes a thinned portion WL1a continuing into the region including the memory cell array 1, and the terrace portion WL1b thicker than the thinned portion WL1a.

The electrode layer WL2 includes a thinned portion WL2a continuing into the region including the memory cell array 1, and the terrace portion WL2b thicker than the thinned portion WL2a. The terrace portion WL2b of the electrode layer WL2 is provided on the lower level side of the terrace portion WL1b, has a level difference in a staircase configuration between the terrace portion WL2b of the electrode layer WL2 and the terrace portion WL1b of the electrode layer WL1, and protrudes along the X-direction further than an edge WL1c of the terrace portion WL1b.

The electrode layer WL3 is provided under the electrode layer WL1 with one layer of the insulating layer 72 interposed. The electrode layer WL3 is provided between the electrode layer WL1 and the thinned portion WL2a of the electrode layer WL2. The electrode layer WL3 has an edge WL3c receding further than the edge WL1c of the terrace portion WL1b of the electrode layer WL1; and the receding is in the reverse direction (in FIG. 5, the right direction) of the protruding direction (in FIG. 5, the left direction) of the terrace portion WL2b of the electrode layer WL2.

The electrode layer WL4 is provided under the electrode layer WL3 with one layer of the insulating layer 72 interposed. The electrode layer WL4 is provided between the electrode layer WL3 and the thinned portion WL2a of the electrode layer WL2. The electrode layer WL4 has an edge WL4c receding further than the edge WL1c of the terrace portion WL1b of the electrode layer WL1 and the edge WL3c of the electrode layer WL3; and the receding is in the reverse direction of the protruding direction of the terrace portion WL2b of the electrode layer WL2.

The electrode layer WL5 is provided under the electrode layer WL2 with one layer of the insulating layer 72 interposed. The electrode layer WL5 has an edge WL5c receding further than an edge WL2c of the terrace portion WL2b of the electrode layer WL2; and the receding is in the reverse direction of the protruding direction of the terrace portion WL2b.

The electrode layer WL6 is provided under the electrode layer WL5 with one layer of the insulating layer 72 interposed. The electrode layer WL6 has an edge WL6c receding further than the edge WL2c of the terrace portion WL2b of the electrode layer WL2 and the edge WL5c of the electrode layer WL5; and the receding is in the reverse direction of the protruding direction of the terrace portion WL2b.

In the following description, "receding" refers to receding in the right direction in FIG. 5.

The edges WL3c and WL4c of the electrode layers WL3 and WL4 positioned under the terrace portion WL1b recede toward the region including the memory cell array 1 further than the edge WL1c of the terrace portion WL1b above the edges WL3c and WL4c. The edge WL4c of the electrode layer WL4 of the lower layer recedes further than the edge WL3c of the electrode layer WL3 of the upper layer.

The edges WL5c and WL6c of the electrode layers WL5 and WL6 positioned under the terrace portion WL2b recede toward the region including the memory cell array 1 further than the edge WL2c of the terrace portion WL2b above the edges WL5c and WL6c. The edge WL6c of the electrode layer WL6 of the lower layer recedes further than the edge WL5c of the electrode layer WL5 of the upper layer.

Also, edges 72c of the multiple insulating layers 72 under the terrace portion WL1b each recede further than the edge WL1c of the terrace portion WL1b.

The edge 72c of the insulating layer 72 between the electrode layer WL3 and the electrode layer WL4 recedes further than the edge WL3c of the electrode layer WL3 and the edge 72c of the insulating layer 72 between the electrode layer WL1 and the electrode layer WL3. The edge 72c of the insulating layer 72 between the electrode layer WL4 and the electrode layer WL2 recedes further than the edge WL4c of the electrode layer WL4 and the edge 72c of the insulating layer 72 between the electrode layer WL3 and the electrode layer WL4.

The edge WL3c of the electrode layer WL3 is a tilted surface tilted with respect to the X-direction and the Z-direction; and the corner between the tilted surface and the lower surface of the electrode layer WL3 recedes further than the corner between the tilted surface and the upper surface of the electrode layer WL3.

The edge WL4c of the electrode layer WL4 is a tilted surface tilted with respect to the X-direction and the Z-direction; and the corner between the tilted surface and the lower surface of the electrode layer WL4 recedes further than the corner between the tilted surface and the upper surface of the electrode layer WL4.

Also, the edges 72c of the three layers of the insulating layers 72 between the electrode layer WL1 and the electrode layer WL2 each are tilted surfaces. The edges 72c of the three layers of the insulating layers 72, the edge WL3c of the electrode layer WL3, and the edge WL4c of the electrode layer WL4 form a tilted surface from the edge WL1c of the terrace portion WL1b to the upper surface of the electrode layer WL2 and are continuous. A tilted surface that continues from the tilted surface recited above formed from the layers under the edge WL1c of the terrace portion WL1b of the electrode layer WL1 also is provided in the edge WL1c. The terrace portion WL1b of the electrode layer WL1 has a configuration in which the tilted surface recited above is formed by the corner facing the terrace portion WL2b of the electrode layer WL2 being beveled.

The edges 72c of the multiple insulating layers 72 under the terrace portion WL2b each recede further than the edge WL2c of the terrace portion WL2b.

Similarly to the edges of the layers under the terrace portion WL1b, a tilted surface that continues from a portion of the edge WL2c of the terrace portion WL2b is formed in the edges of the layers under the terrace portion WL2b.

The surface of the staircase portion 2 is covered with an insulating film 45. The insulating film 45 covers the upper surface of the terrace portion WL1b and the upper surface of the terrace portion WL2b.

The insulating film 45 covers the edge WL1c of the terrace portion WL1b of the electrode layer WL1, the edge WL3c of the electrode layer WL3, the edge WL4c of the electrode layer WL4, the edge WL2c of the terrace portion WL2b of the electrode layer WL2, the edge WL5c of the electrode layer WL5, the edge WL6c of the electrode layer WL6, and the edges 72c of the insulating layers 72.

The insulating film 45 fills between the electrode layer WL2 and the tilted surface recited above formed from the edges of the layers under the terrace portion WL1b of the electrode layer WL1.

An insulating film 46 is provided to fill the level difference of the staircase portion 2 on the insulating film 45. The insulating film 45 and the insulating film 46 are, for example, silicon oxide films.

Contact portions CC are provided on the terrace portions WL1b and WL2b. The contact portions CC are conductive bodies having substantially circular columnar configurations. The contact portions CC extend through the insulating film 46 in the Z-direction, pierce the insulating film 45, and are connected to the terrace portions WL1b and WL2b.

The contact portions CC are connected to not-illustrated upper layer interconnects. For example, the upper layer interconnects are electrically connected to a control circuit formed in the surface of the substrate 10.

After forming the insulating film 46, multiple contact holes that extend through the insulating film 46 in the Z-direction and reach the terrace portions WL1b and WL2b (70b) are formed. The contact portions CC are formed by forming a conductive material inside the contact holes.

For example, the multiple contact holes are collectively formed by RIE (Reactive Ion Etching). Deep contact holes that reach the terrace portions 70b further on the lower level side and shallow contact holes that reach the terrace portions 70b further on the upper level side are formed simultaneously. Due to such an etching depth difference, for example, a shallow contact hole may pierce the terrace portion 70b to be connected and reach another electrode layer 70 under the terrace portion 70b. This may cause a short between different electrode layers 70 via the contact portion CC.

According to the embodiment, by increasing the film thickness of the terrace portion 70b, the etching that forms the contact hole can be stopped reliably at the terrace portion 70b; and the contact hole can be prevented from extending through under the terrace portion 70b.

As described below, the thick terrace portion 70b is obtained by adding a film by stacking on the upper surface of the portion of the electrode layer 70 used to form the terrace portion 70b. Accordingly, the film thickness of the terrace portion 70b is increased to protrude upward. In the case where the terrace portion 70b becomes thicker upward, the distance between the terrace portion 70b and the edges of the other electrode layers 70 positioned at the vicinity of the sidewall of the staircase portion 2 decreases; and the breakdown voltage between the two may decrease.

Therefore, in the example shown in FIG. 5, by causing the edge WL3c of the electrode layer WL3 and the edge WL4c of the electrode layer WL4 to recede to be distal to the sidewall of the staircase portion 2, the distances between the terrace portion WL2b having the increased film thickness and the edges WL3c and WL4c can be widened. This increases the breakdown voltage between the electrode layer WL3 and the terrace portion WL2b of the electrode layer WL2 and the breakdown voltage between the electrode layer WL4 and the terrace portion WL2b of the electrode layer WL2.

In particular, the breakdown voltage between the electrode layer WL4 and the terrace portion WL2b of the electrode layer WL2 can be improved reliably by causing the edge WL4c of the electrode layer WL4 which is more proximal to the terrace portion WL2b to recede further than the edge WL3c of the electrode layer WL3.

The edges WL3c and WL4c of the electrode layers WL3 and WL4 are tilted surfaces; and the lower corner of the tilted surface more proximal to the terrace portion WL2b recedes further than the upper corner. Such an edge configuration is advantageous for a higher breakdown voltage between the terrace portion WL2b and the electrode layers WL3 and WL4.

A method for manufacturing the semiconductor device of the embodiment will now be described.

First, a method for manufacturing the memory cell array 1 will be described with reference to FIG. 6 to FIG. 14.

Figure 6:
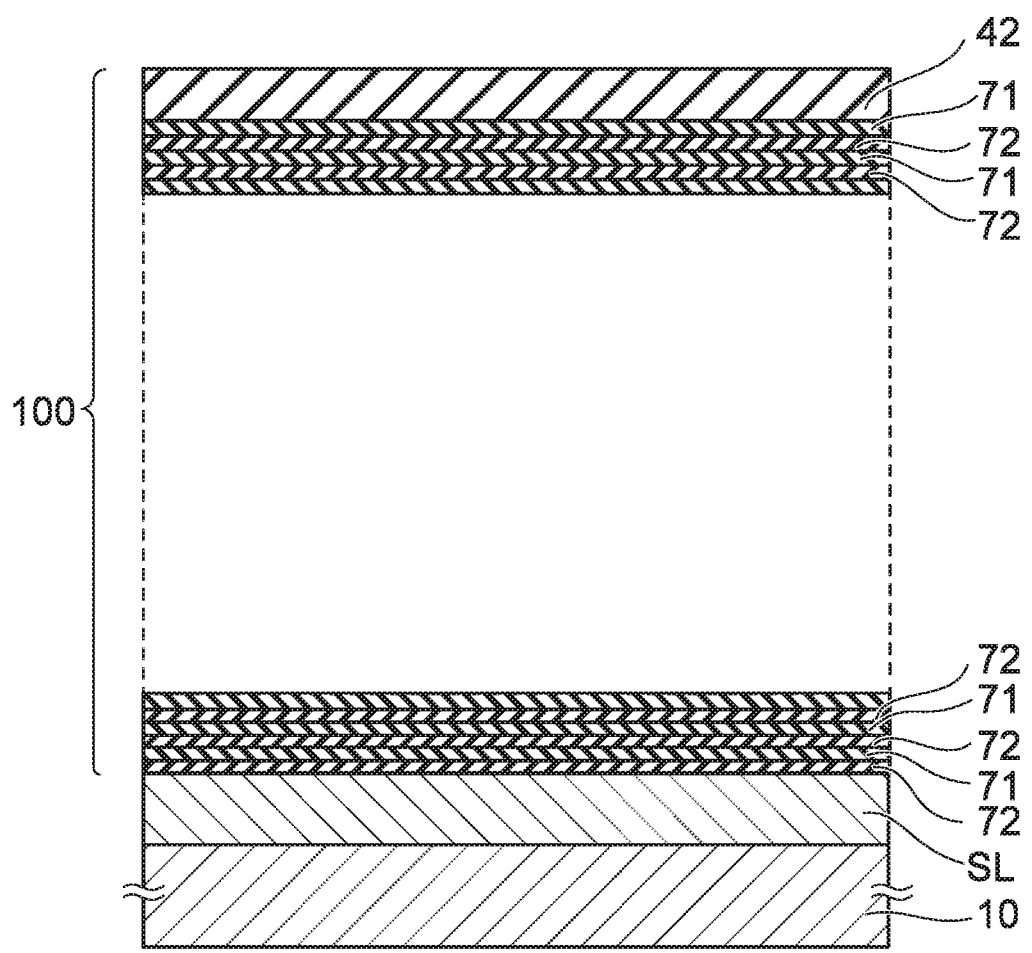
FIG. 6 to FIG. 14 are schematic cross-sectional views showing a method for manufacturing the memory cell array of the embodiment.

As shown in FIG. 6, the source layer SL is formed on the substrate 10; and the stacked body 100 including multiple sacrificial layers 71 and the multiple insulating layers 72 is formed on the source layer SL. For example, the sacrificial layers 71 are silicon nitride layers; and the insulating layers 72 are silicon oxide layers.

The insulating layer 72 is formed on the surface of the source layer SL; and the sacrificial layer 71 is formed on the insulating layer 72. Thereafter, the processes of alternately stacking the insulating layer 72 and the sacrificial layer 71 are repeated. The insulating film 42 is formed on the sacrificial layer 71 of the uppermost layer.

Figure 7:
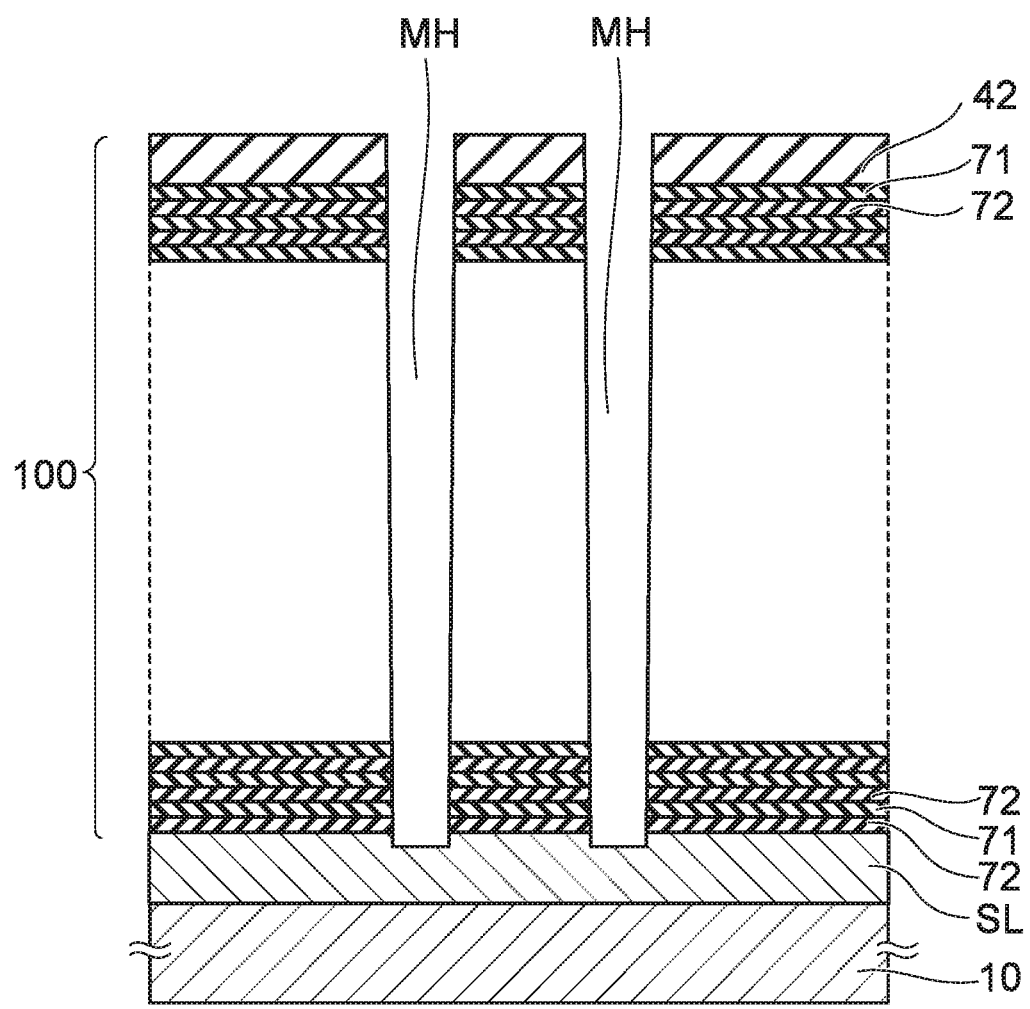

As shown in FIG. 7, multiple memory holes MH are formed in the stacked body 100. The memory holes MH are formed by RIE using a not-illustrated mask. The memory holes MH pierce the stacked body 100 and reach the source layer SL.

Figure 8:
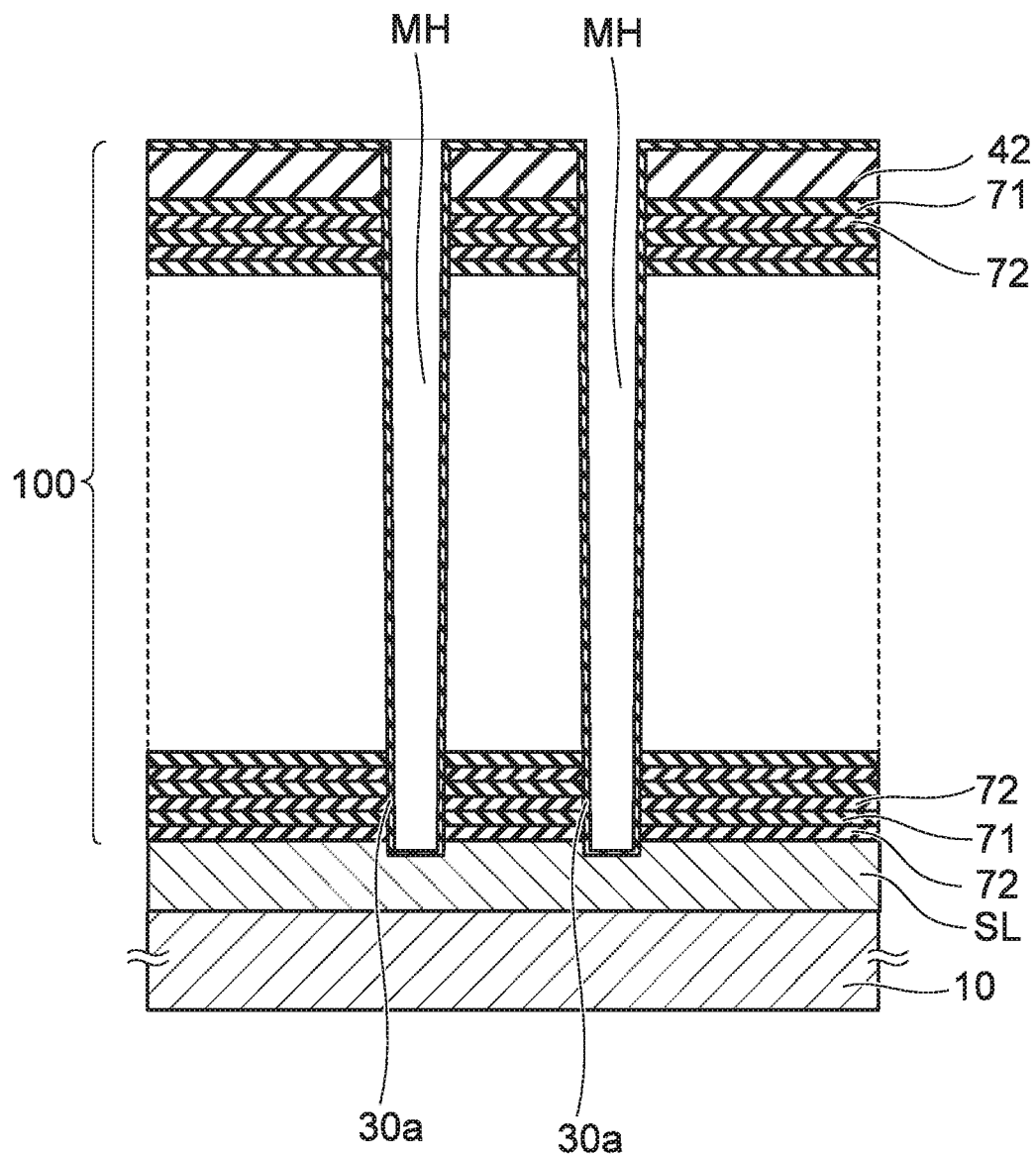
Figure 9:
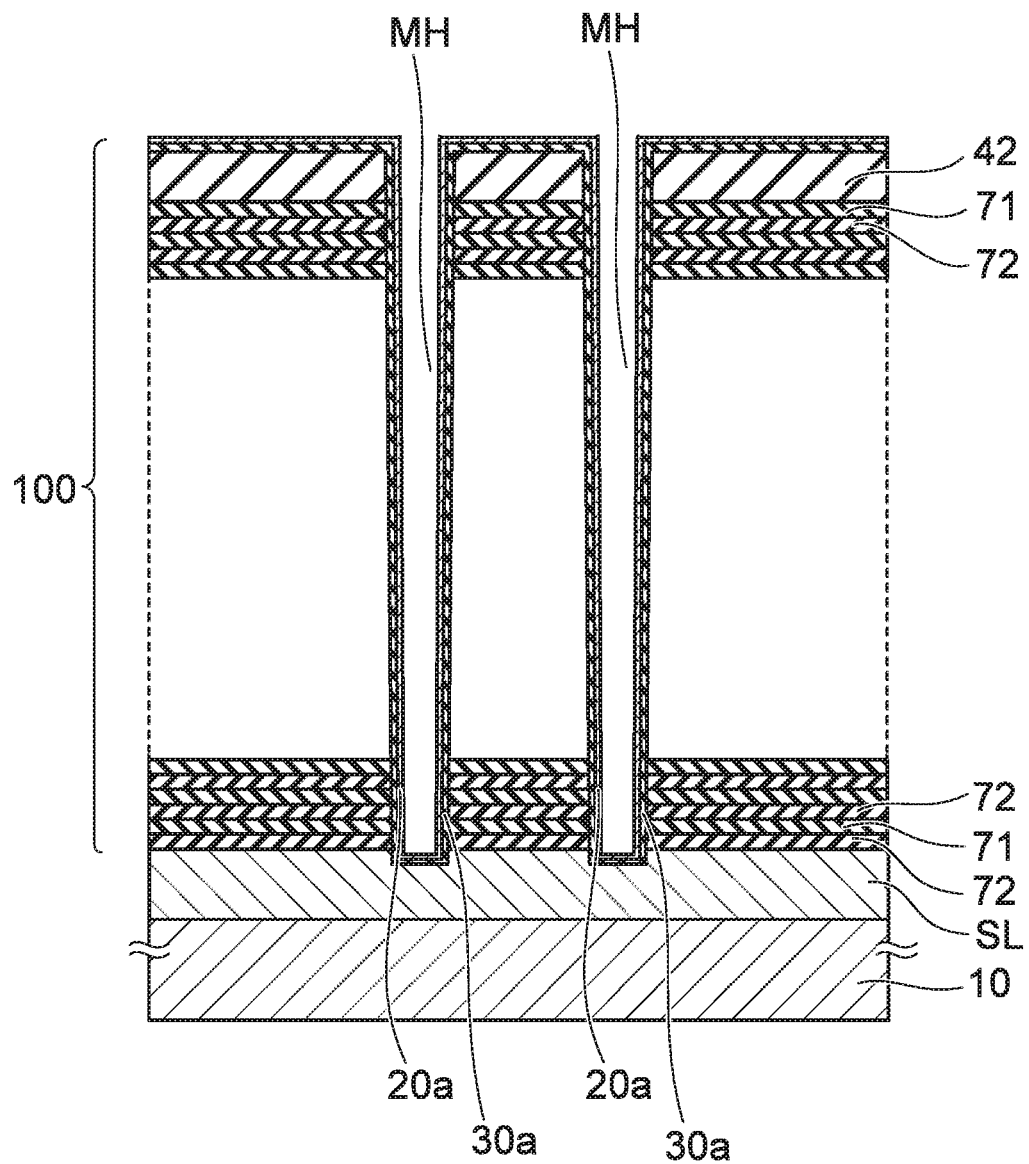

As shown in FIG. 8, a stacked film 30a is formed conformally on the side surfaces and the bottom surfaces of the memory holes MH. The stacked film 30a includes the tunneling insulating film 31 and the charge storage film 32 shown in FIG. 4. As shown in FIG. 9, a cover semiconductor film 20a is formed conformally on the inner side of the stacked film 30a.

Figure 10:
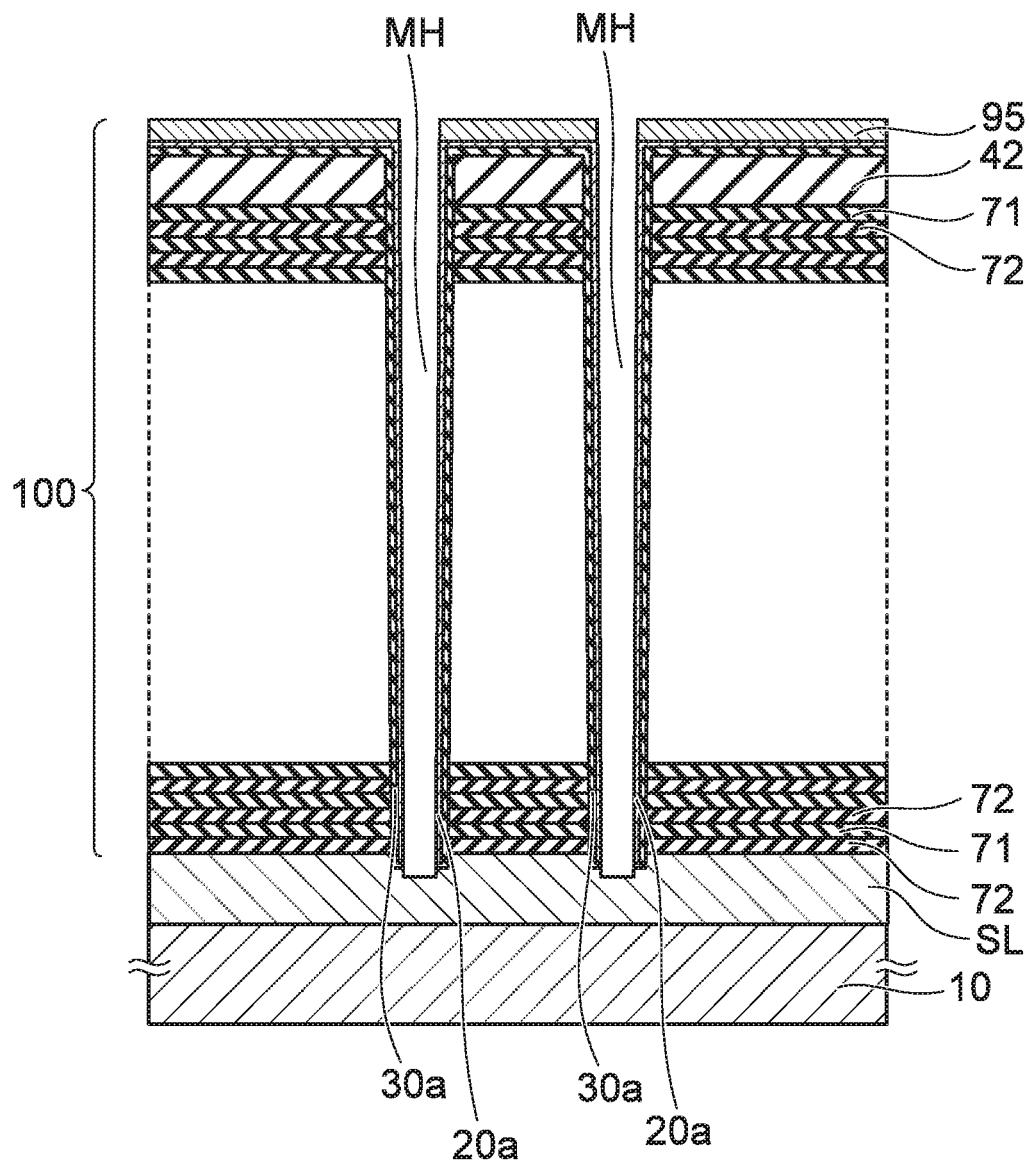

Subsequently, as shown in FIG. 10, a mask layer 95 is formed on the stacked body 100; and the cover semiconductor film 20a and the stacked film 30a that are formed on the bottom surfaces of the memory holes MH are removed by RIE. In the RIE, the stacked film 30a formed on the side surfaces of the memory holes MH is protected by being covered with the cover semiconductor film 20a. The stacked film 30a formed on the side surfaces of the memory holes MH is not damaged by the RIE.

Figure 11:
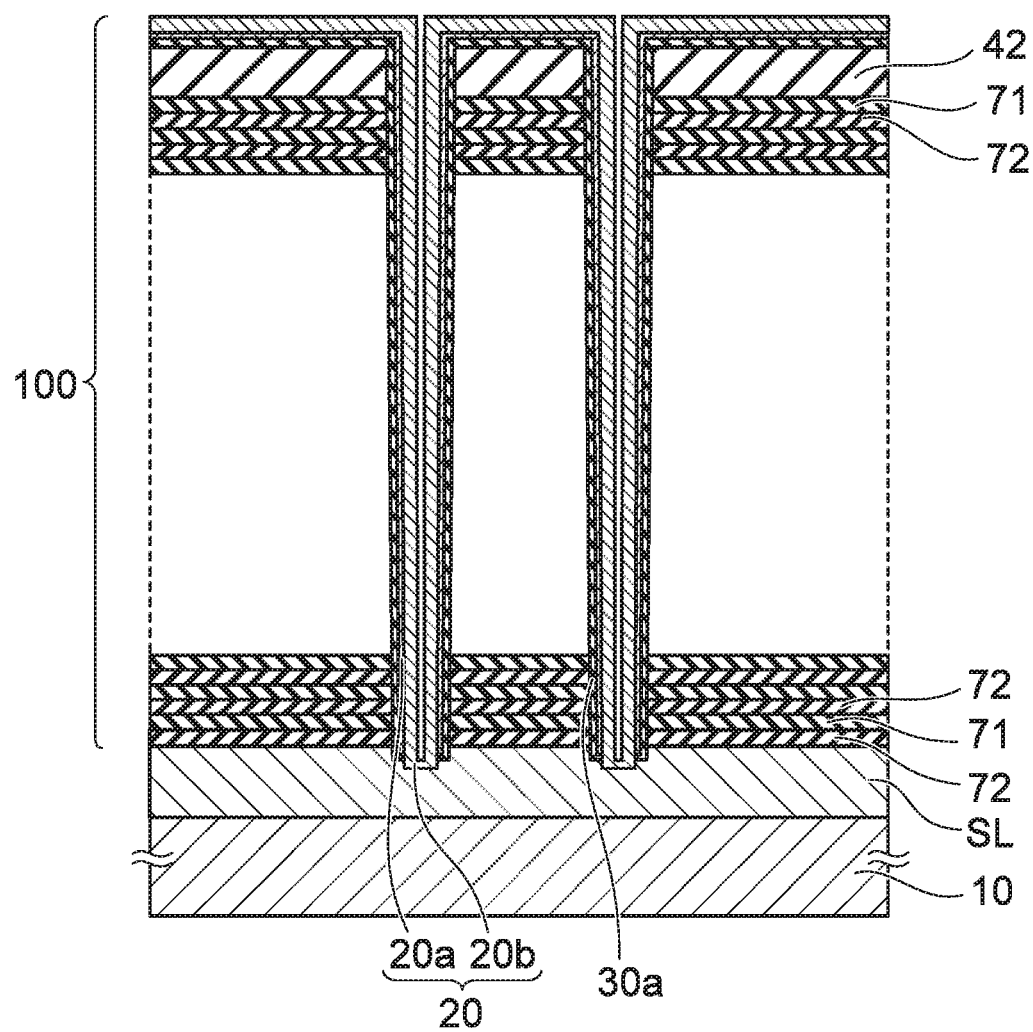

After removing the mask layer 95, a semiconductor film 20b is formed inside the memory holes MH as shown in FIG. 11. The semiconductor film 20b is formed on the side surface of the cover semiconductor film 20a and the bottom surfaces of the memory holes MH where the source layer SL is exposed.

For example, the cover semiconductor film 20a and the semiconductor film 20b are formed as amorphous silicon films and subsequently crystallized into polycrystalline silicon films by heat treatment. The cover semiconductor film 20a and the semiconductor film 20b are included in the semiconductor body 20 described above.

Figure 12:
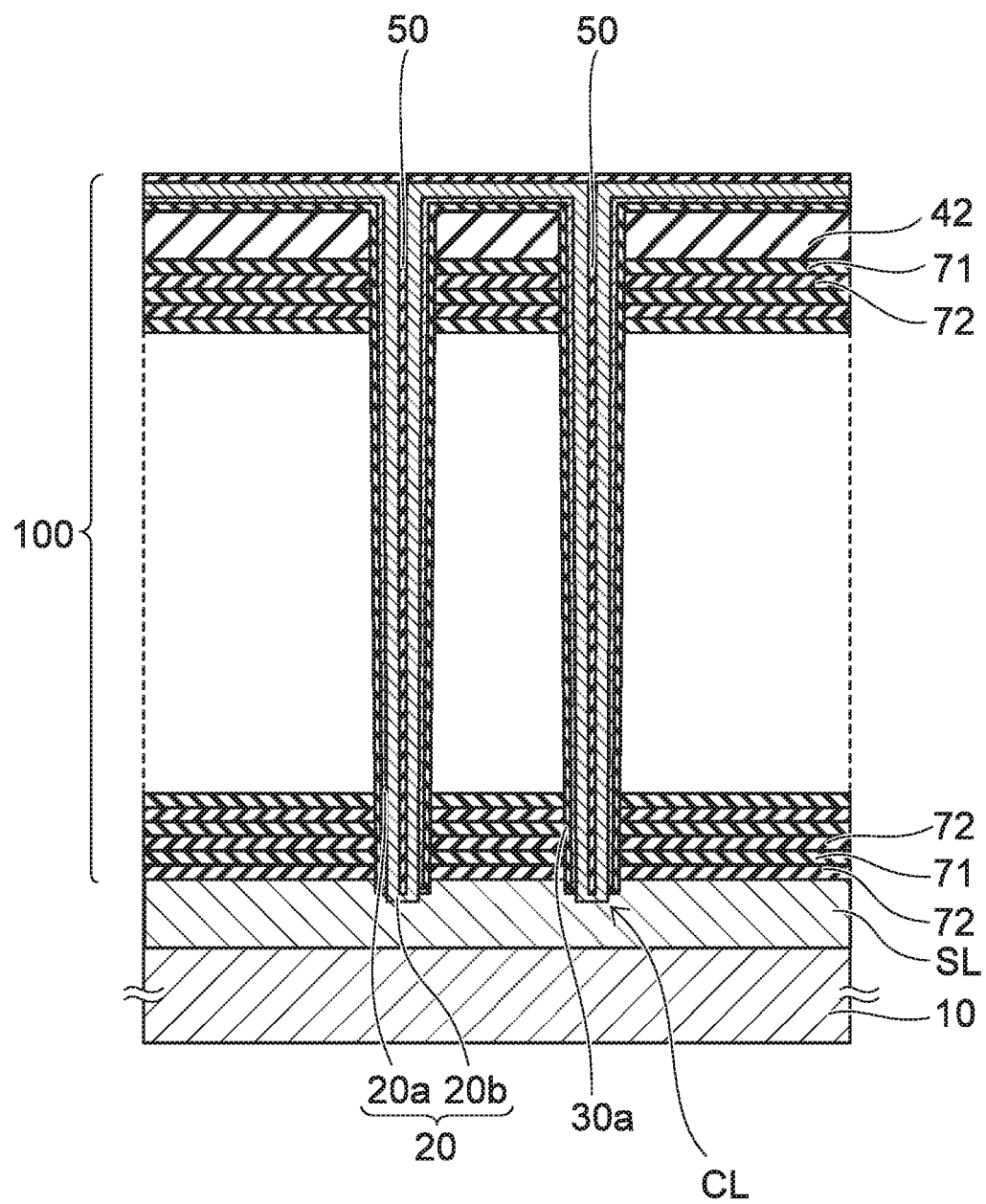

As shown in FIG. 12, the core film 50 is formed on the inner side of the semiconductor film 20b. Thus, the columnar portion CL including the stacked film 30a, the semiconductor body 20, and the core film 50 is formed.

The films deposited on the insulating film 42 shown in FIG. 12 are removed by CMP (chemical mechanical polishing) or etch-back.

Figure 13:
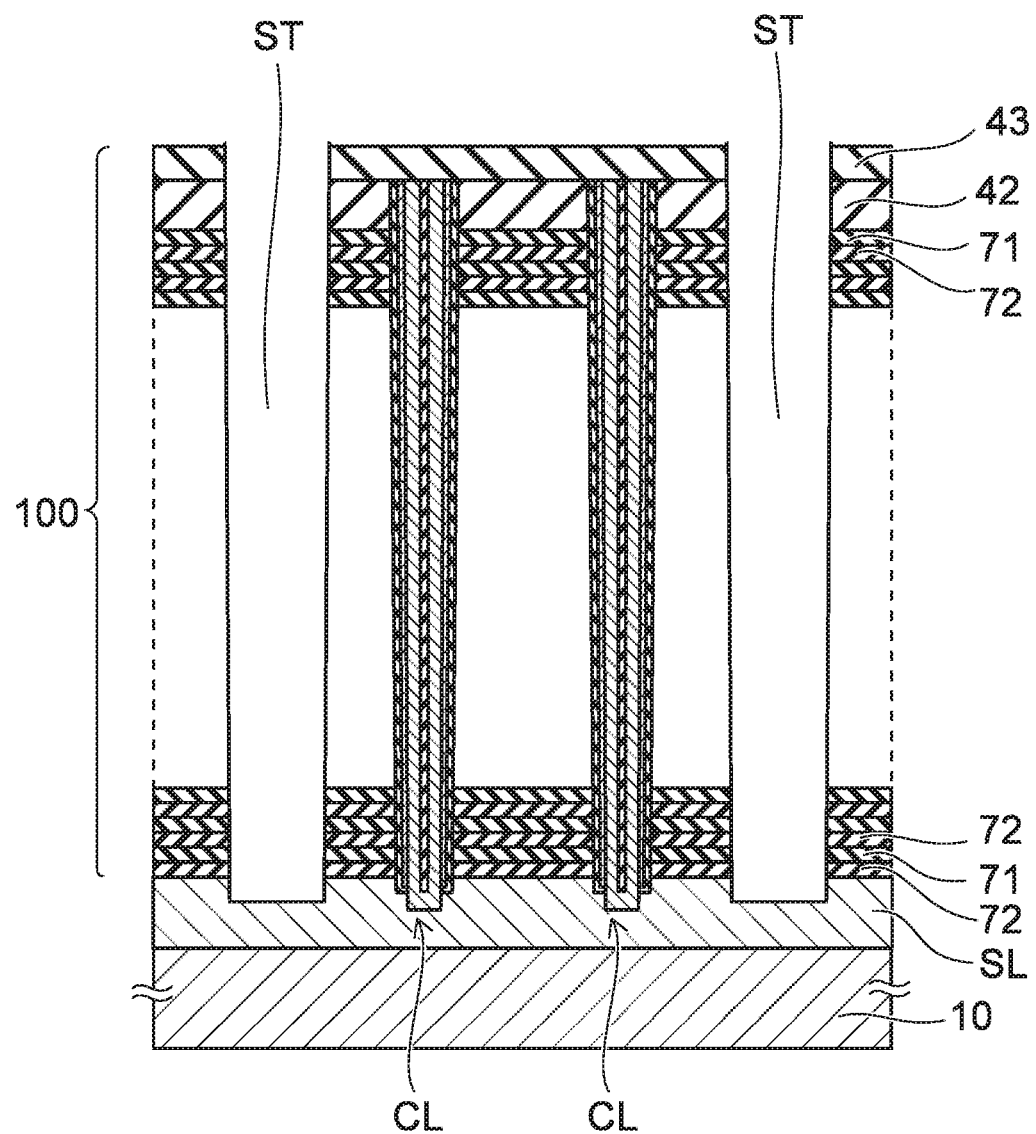

Subsequently, as shown in FIG. 13, the insulating film 43 is formed on the insulating film 42. The insulating film 43 covers the upper ends of the columnar portions CL. Then, multiple slits ST are formed in the stacked body 100 including the insulating film 43, the insulating film 42, the multiple sacrificial layers 71, and the multiple insulating layers 72 by RIE using a not-illustrated mask. The slits ST pierce the stacked body 100 and reach the source layer SL.

Figure 14:
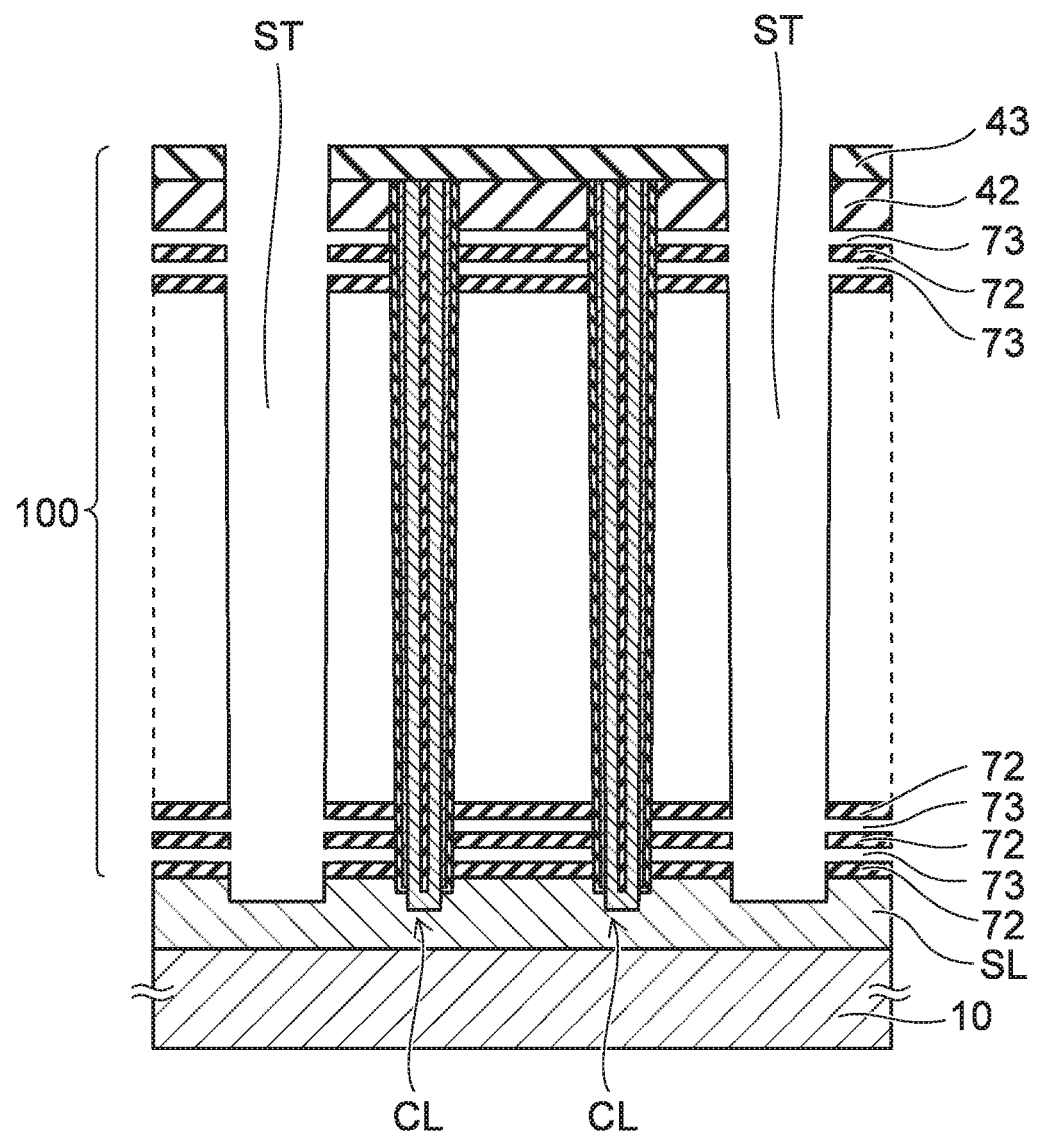

Then, the sacrificial layers 71 are removed using an etching gas or an etchant supplied through the slits ST. For example, the sacrificial layers 71 which are silicon nitride layers are removed by a solution including phosphoric acid. The sacrificial layers 71 are removed; and air gaps 73 are formed between the insulating layers 72 adjacent to each other in the stacking direction as shown in FIG. 14. The air gap 73 is formed also between the insulating film 42 and the insulating layer 72 of the uppermost layer.

The multiple insulating layers 72 contact the side surfaces of the multiple columnar portions CL to surround the side surfaces of the multiple columnar portions CL. The multiple insulating layers 72 are supported by such a physical bond with the multiple columnar portions CL; and the air gaps 73 are maintained.

The first blocking film 34, the second blocking film 35, and a barrier metal 81 shown in FIG. 4 are formed in order on the inner walls of the air gaps 73. The first blocking film 34, the second blocking film 35, and the barrier metal 81 are formed conformally along the upper surface of the insulating layer 72, the lower surface of the insulating layer 72, and the side surface of the columnar portion CL. For example, a titanium nitride film is formed as the barrier metal 81.

The air gaps 73 still remain after forming the barrier metal 81. The electrode layers 70 are filled into the remaining air gaps 73. For example, tungsten layers are formed as the electrode layers 70 by CVD (Chemical Vapor Deposition) or ALD (Atomic Layer Deposition) using a gas including tungsten fluoride and hydrogen.

Subsequently, the separation portions 60 are formed by forming the insulating films 61 shown in FIG. 3 inside the slits ST.

A method for manufacturing the staircase portion 2 shown in FIG. 5 will now be described with reference to FIG. 15A to FIG. 24.

Figure 15A:
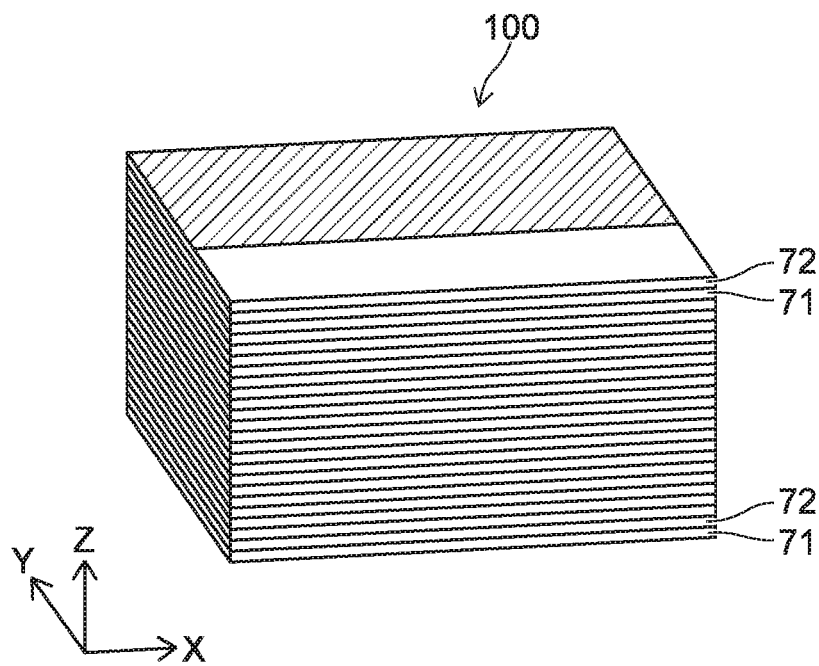
FIG. 15A to FIG. 18 are schematic cross-sectional views showing a method for manufacturing the staircase portion of the embodiment.

FIG. 15A is a perspective view of a portion of the stacked body 100 including the multiple sacrificial layers 71 and the multiple insulating layers 72.

The insulating layer 72 and the sacrificial layer 71 that are in a region exposed from a resist are etched by RIE one layer at a time in a state in which the region shown by diagonal lines in FIG. 15A is covered with the resist. The state after the etching is illustrated in FIG. 15B.

Figure 15B:
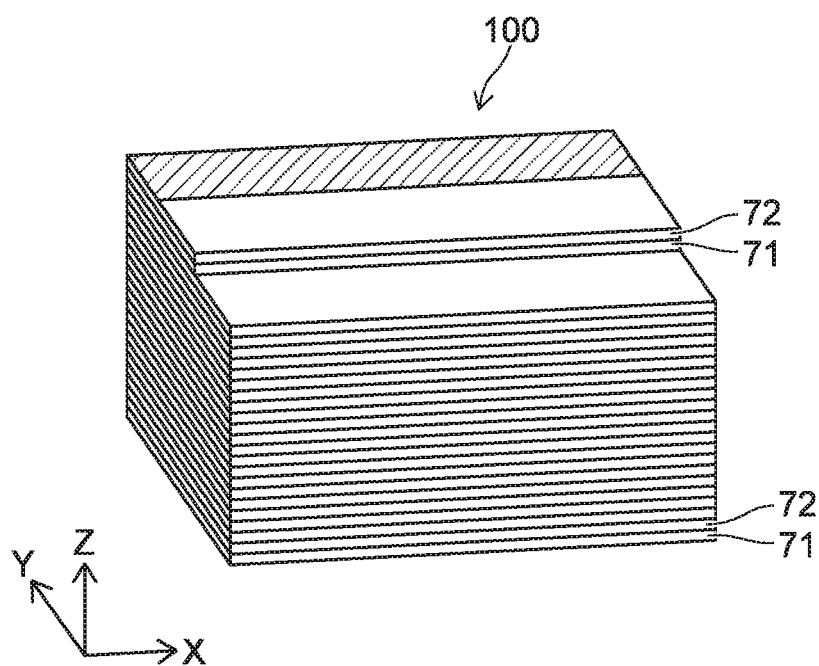

The insulating layers 72 and the sacrificial layers 71 that are in a region exposed from a resist are further etched by RIE one layer at a time in a state in which the region shown by diagonal lines in FIG. 15B is covered with the resist.

Figure 16A:
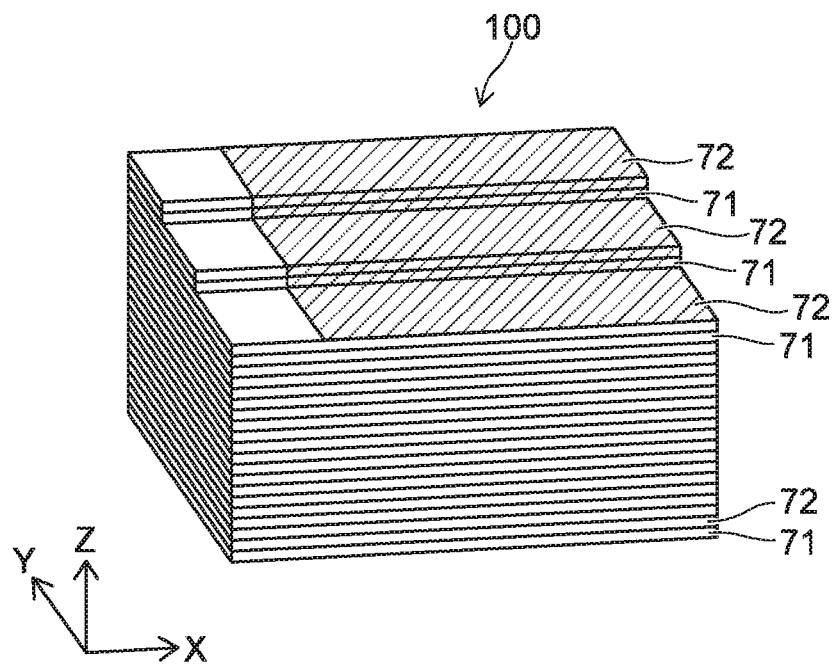

Thus, as shown in FIG. 16A, staircase columns are formed along the Y-direction in a portion of the stacked body 100. One sacrificial layer 71 and the sacrificial layer 71 one layer below or one layer above the one sacrificial layer 71 are included in one step of the staircase columns along the Y-direction.

Then, the insulating layers 72 and the sacrificial layers 71 that are in a region exposed from a resist are etched by performing RIE multiple layers (e.g., three layers) at a time in a state in which the region shown by diagonal lines in FIG. 16A is covered with the resist. The state after the etching is illustrated in FIG. 16B.

Figure 16B:
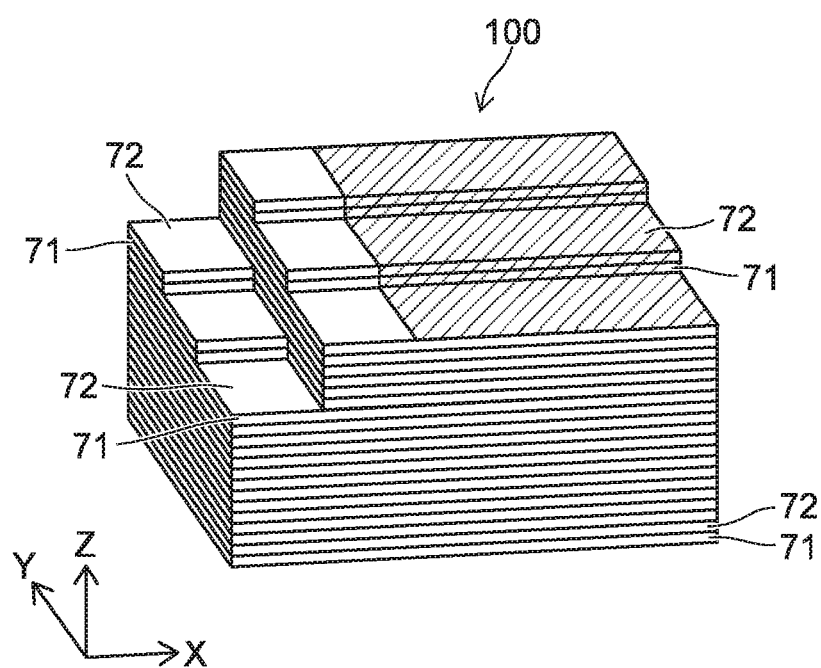

The insulating layers 72 and the sacrificial layers 71 that are in a region exposed from a resist are further etched by RIE three layers at a time in a state in which the region shown by diagonal lines in FIG. 16B is covered with the resist. The state after the etching is illustrated in FIG. 17A.

Figure 17A:
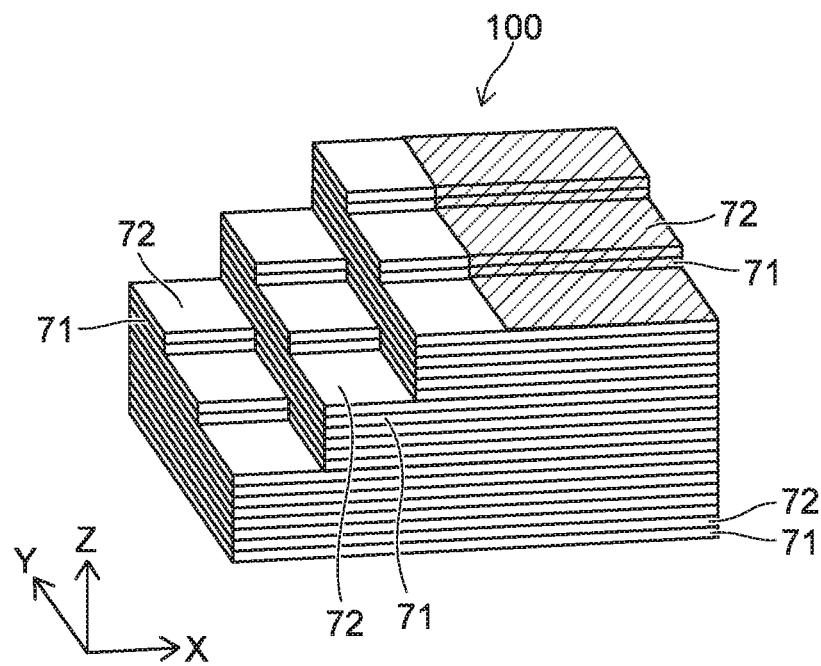

The insulating layers 72 and the sacrificial layers 71 that are in a region exposed from a resist are further etched by RIE three layers at a time in a state in which the region shown by diagonal lines in FIG. 17A is covered with the resist.

Figure 17B:
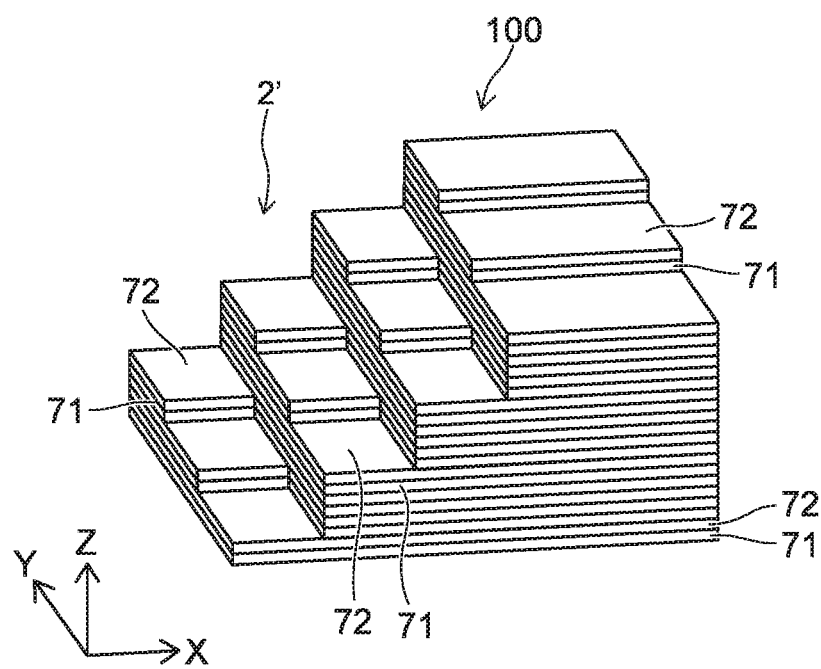

Thus, as shown in FIG. 17B, staircase columns along the X-direction are formed in a portion of the stacked body 100. One sacrificial layer 71 and the sacrificial layers 71 of three layers below or three layers above are included in one step of the staircase columns along the X-direction.

A staircase portion 2' is formed and includes the staircase columns along the X-direction in addition to the staircase columns along the Y-direction formed in the previous process. The insulating layer 72 included in the uppermost layer of the staircase portion 2' is removed by RIE.

Figure 18:
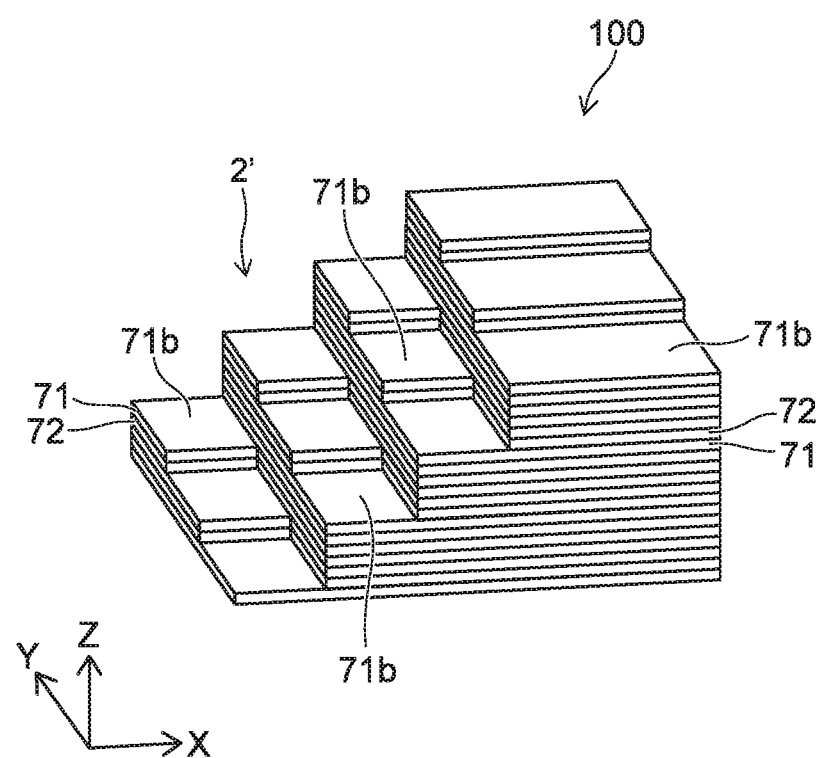

Thereby, as shown in FIG. 18, the staircase portion 2' is obtained in which multiple terrace portions 71b of the multiple sacrificial layers 71 are exposed at the uppermost layers and arranged in a staircase configuration in the X-direction and the Y-direction.

Figure 19A:
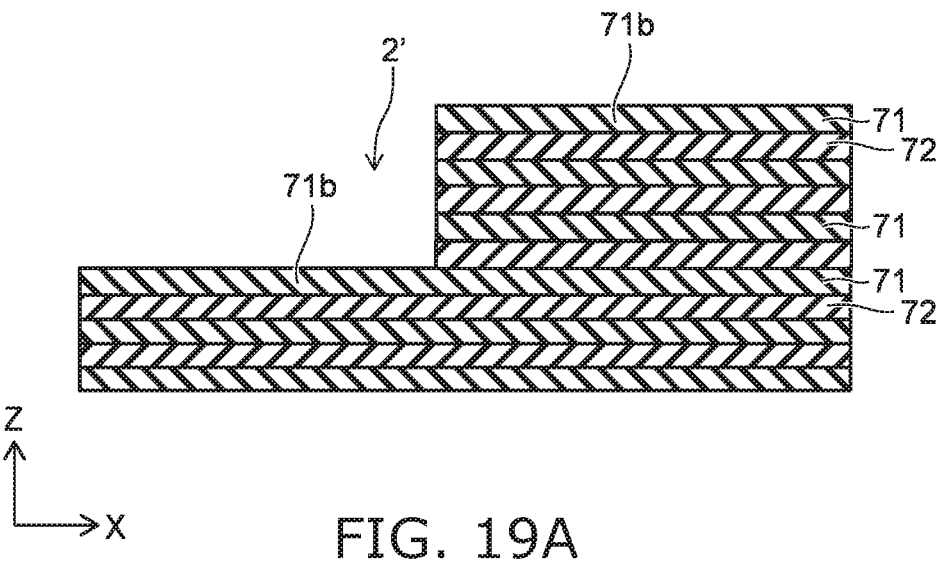
FIG. 19A to FIG. 24 are schematic cross-sectional views showing a method for manufacturing the staircase portion shown in FIG. 5.

FIG. 19A is a cross-sectional view of a portion of the staircase portion 2' including one arbitrary step along the X-direction.

Figure 19B:
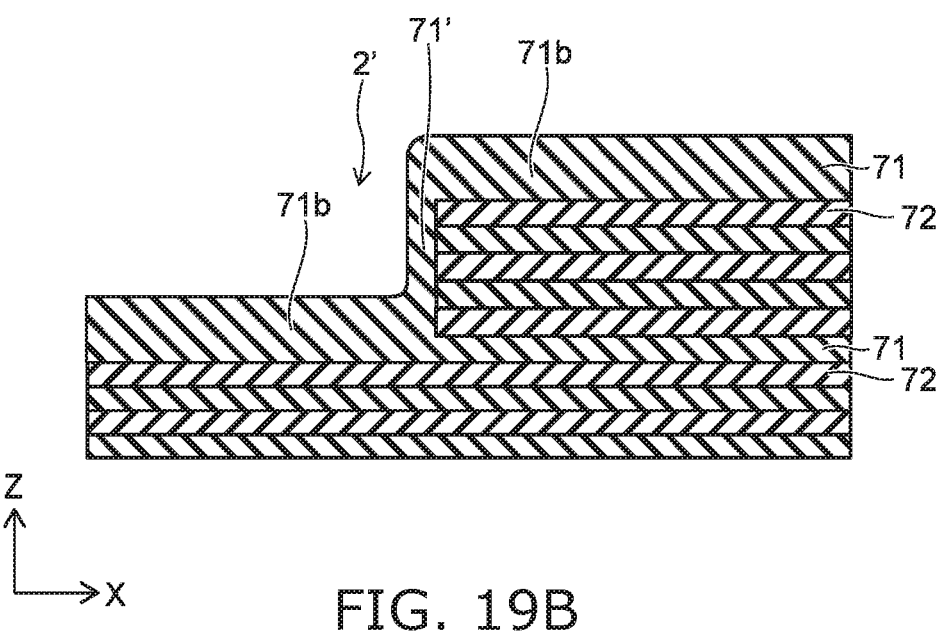

A film (e.g., a silicon nitride film) 71' of the same material as the sacrificial layers 71 is formed by, for example, CVD on the terrace portions 71b of the sacrificial layers 71; and the film thicknesses of the terrace portions 71b are increased as shown in FIG. 19B.

Figure 20A:
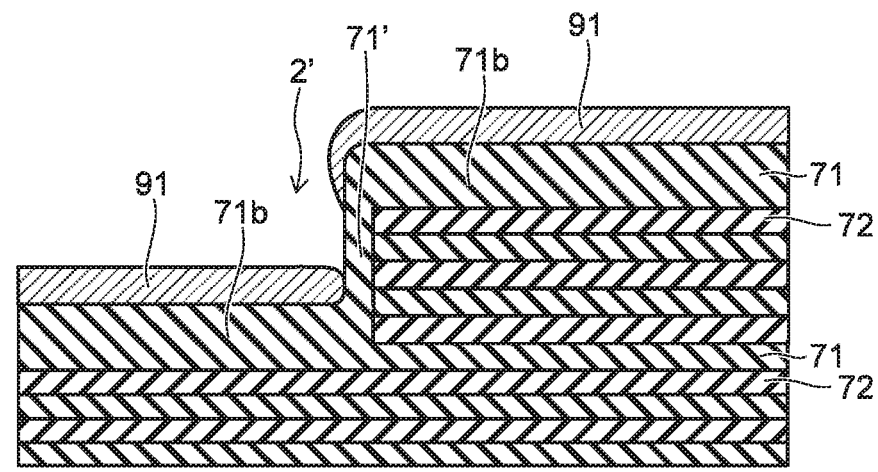

Subsequently, as shown in FIG. 20A, a protective film 91 that has poor coverage (coverability of differences in levels) is formed on the terrace portions 71b. For example, a carbon film is formed as the protective film 91 by CVD. Then, using the protective film 91 as a mask, the film 71' formed on the sidewall of the staircase portion 2' is removed by etching using a gas including a fluorocarbon such as, for example, $CF_4$, etc.

Figure 20B:
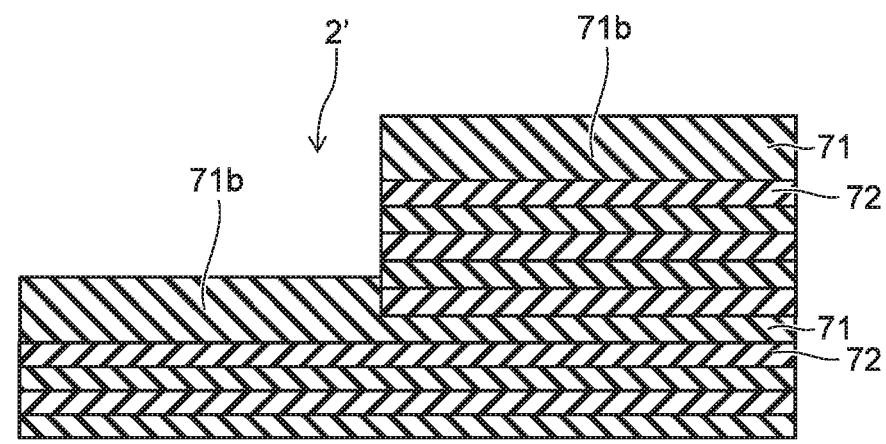

The film 71' covering the sidewall of the staircase portion 2' to connect the terrace portion 71b of the upper level and the terrace portion 71b of the lower level is removed. Subsequently, the protective film 91 is removed; and the film thicknesses of only the terrace portions 71b of the sacrificial layers 71 are increased as shown in FIG. 20B.

Figure 21A:
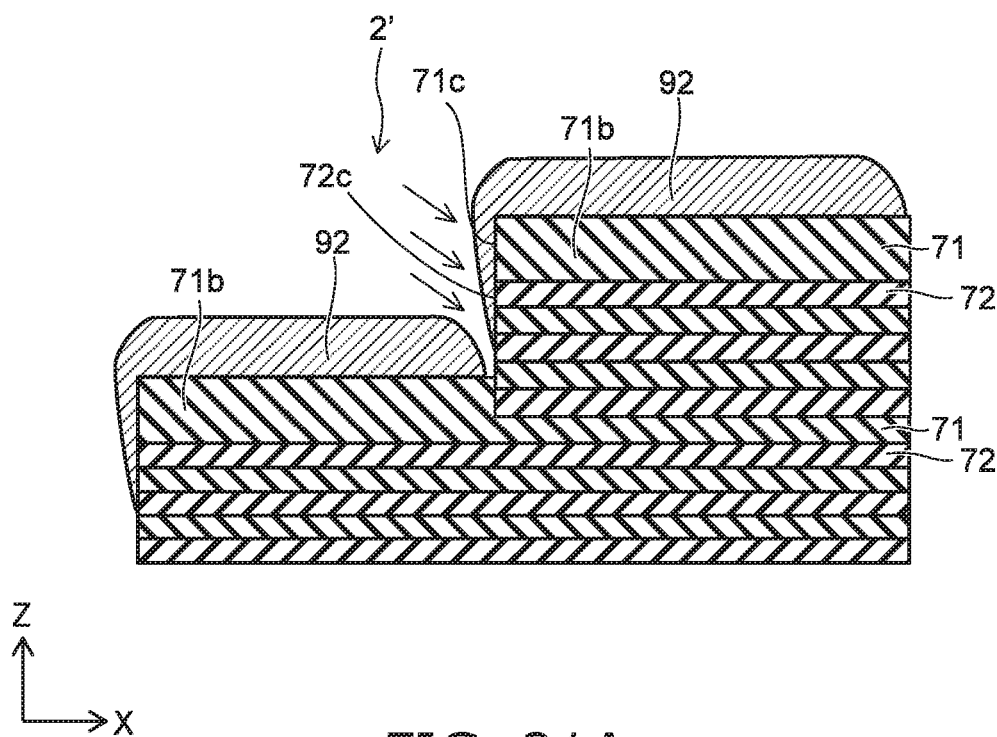

A protective film 92 having poor coverage again is formed on the terrace portions 71b having the increased film thicknesses as shown in FIG. 21A. For example, a carbon film is formed as the protective film 92 by CVD.

The sidewall of the staircase portion 2' is formed from an edge 71c of the terrace portion 71b and from the edge 71c of the sacrificial layer 71 and the edge 72c of the insulating layer 72 continuing below the edge 71c of the terrace portion 71b. The protective film 92 is formed on the sidewall of the staircase portion 2' and has a film thickness thinner than the film thickness of the protective film 92 on the terrace portion 71b. The film thickness of the protective film 92 formed on the sidewall of the staircase portion 2' increases toward the upper portion proximal to the terrace portion 71b of the upper level and decreases toward the lower portion proximal to the terrace portion 71b of the lower level. The sacrificial layers 71 are etched in this state.

For example, the sacrificial layers 71 which are silicon nitride layers are etched using a gas including a fluorocarbon such as $CF_4$, etc. At this time, the insulating layers 72 which are silicon oxide layers also are etched at substantially the same rate as the sacrificial layers 71.

Figure 25:
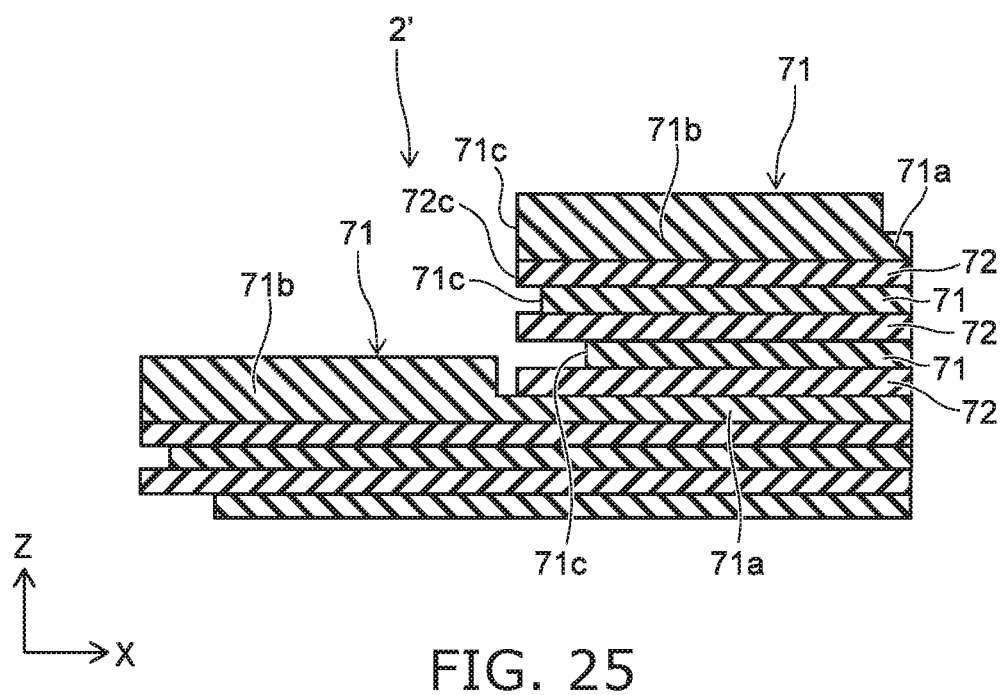
FIG. 25 is a schematic cross-sectional view showing another method for manufacturing the staircase portion.

Or, as shown in FIG. 25, only the sacrificial layers 71 may be caused to recede selectively.

Figure 21B:
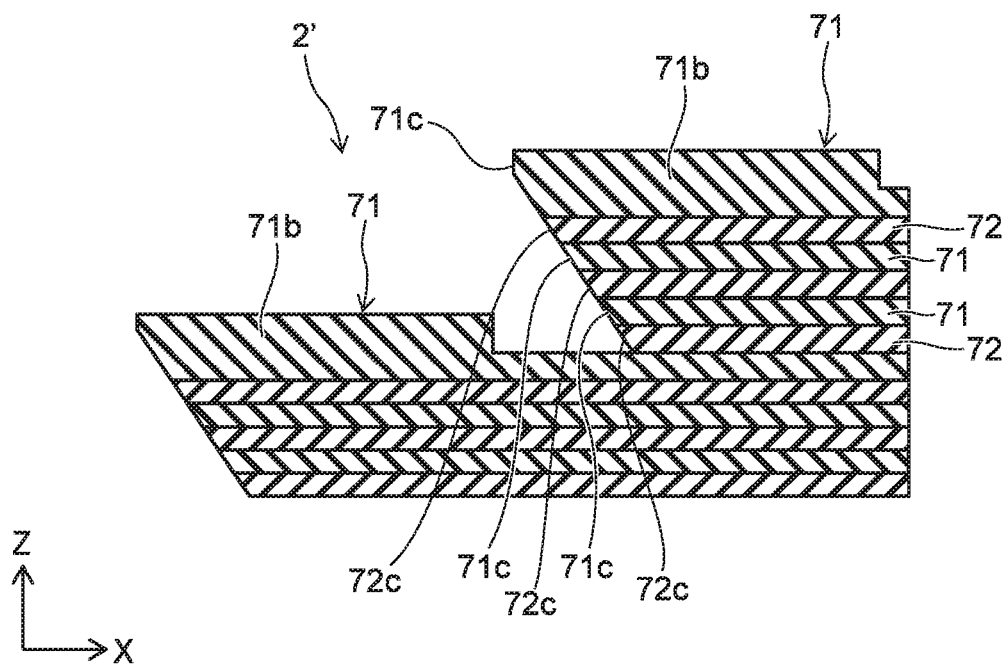

The etching of the sacrificial layers 71 and the insulating layers 72 progresses from the sidewall of the staircase portion 2' where the protective film 92 is thin; and the edges 71c of the sacrificial layers 71 and the edges 72c of the insulating layers 72 that are positioned at the sidewall of the staircase portion 2' recede along the X-direction from the sidewall of the staircase portion 2' as shown in FIG. 21B.

The recessed amounts of the sacrificial layers 71 and the insulating layers 72 are larger toward the lower portion of the sidewall of the staircase portion 2' where the film thickness of the protective film 92 is thinner; and a tilted surface is formed in the sidewall of the staircase portion 2' as shown in FIG. 21B. The tilted surface is formed downward from a portion of the edge 71c of the terrace portion 71b of the upper level and away from the terrace portion 71b of the lower level.

Figure 22A:
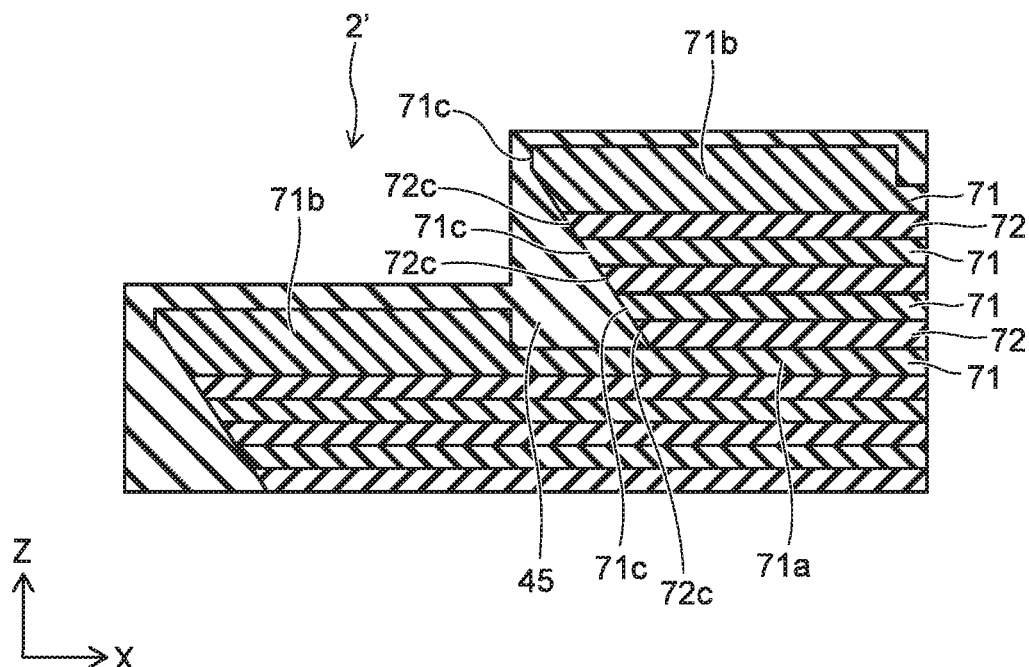

Subsequently, as shown in FIG. 22A, the insulating film 45 is formed to cover the surface of the staircase portion 2'. For example, a silicon oxide film is formed as the insulating film 45 by ALD. The insulating film 45 covers the upper surface of the terrace portion 71b.

Also, the insulating film 45 fills the gap below the tilted surface formed by the receding of the edges 71c of the sacrificial layers 71 and the edges 72c of the insulating layers 72 and covers the edges 71c of the sacrificial layers 71 and the edges 72c of the insulating layers 72.

By causing not only the sacrificial layers 71 but also the insulating layers 72 to recede, compared to the case of FIG. 25, the unevenness of the sidewall of the staircase portion 2' can be small. Therefore, the fillability of the insulating film 45 into the gap facing the edges 71c of the sacrificial layers 71 is excellent; and the edges 71c of the sacrificial layers 71 can be covered reliably with the insulating film 45.

Figure 22B:
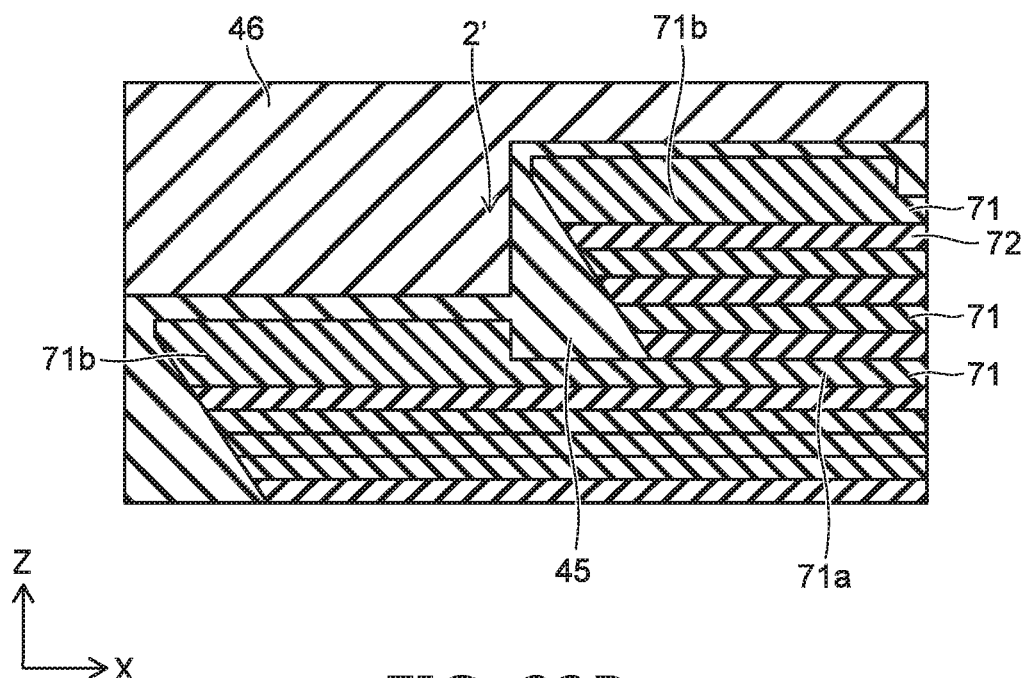

After forming the insulating film 45, the insulating film 46 is formed on the insulating film 45 as shown in FIG. 22B. The insulating film 46 fills the level difference of the staircase portion 2'. For example, a silicon oxide film is formed as the insulating film 46 by CVD.

Figure 23A:
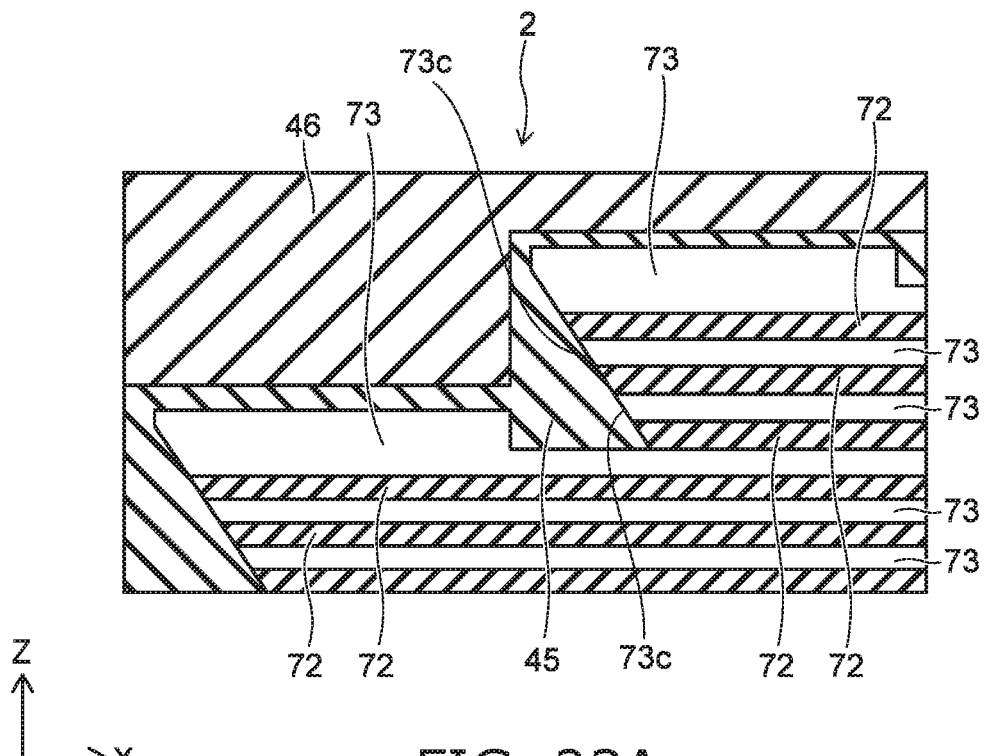

After forming the insulating film 46, the columnar portions CL are formed in the region including the memory cell array 1. Further, the slits ST are formed; and the sacrificial layers 71 are removed by etching through the slits ST. At the staircase portion 2' as well, the sacrificial layers 71 are removed; and the air gaps 73 are formed between the insulating layers 72 as shown in FIG. 23A. The air gaps 73 are formed also at the portions that are covered with the insulating film 46 and the insulating film 45 and used to form the terrace portions.

Figure 23B:
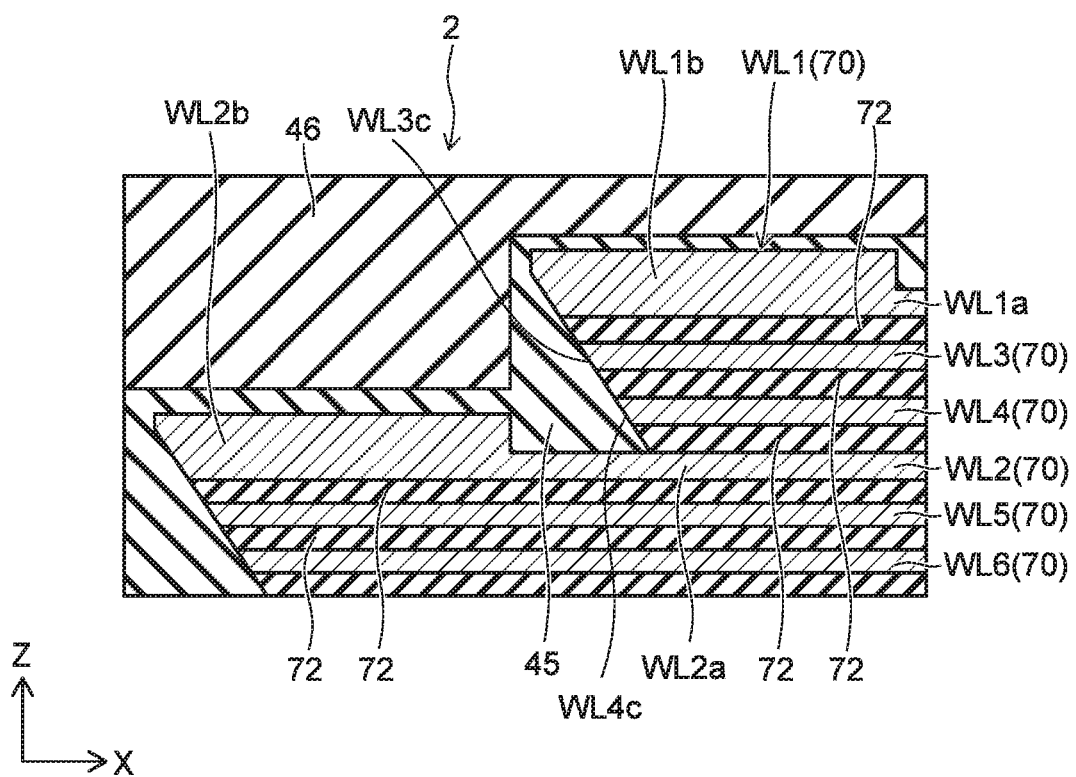

Then, the material of the electrode layers 70 is filled into the air gaps 73 through the slits ST; and the staircase portion 2 shown in FIG. 23B is formed. Because the insulating film 45 is formed reliably to a position covering the edges 71c of the sacrificial layers 71, the positions of edges 73c of the air gaps 73 formed in the process shown in FIG. 23A can match the positions of the edges 71c of the sacrificial layers 71 caused to recede. As a result, as shown in FIG. 23B, the edge WL3c of the electrode layer WL3 and the edge WL4c of the electrode layer WL4 formed in the air gaps 73 can be positioned at positions recessed from the terrace portion WL2b.

Figure 24:
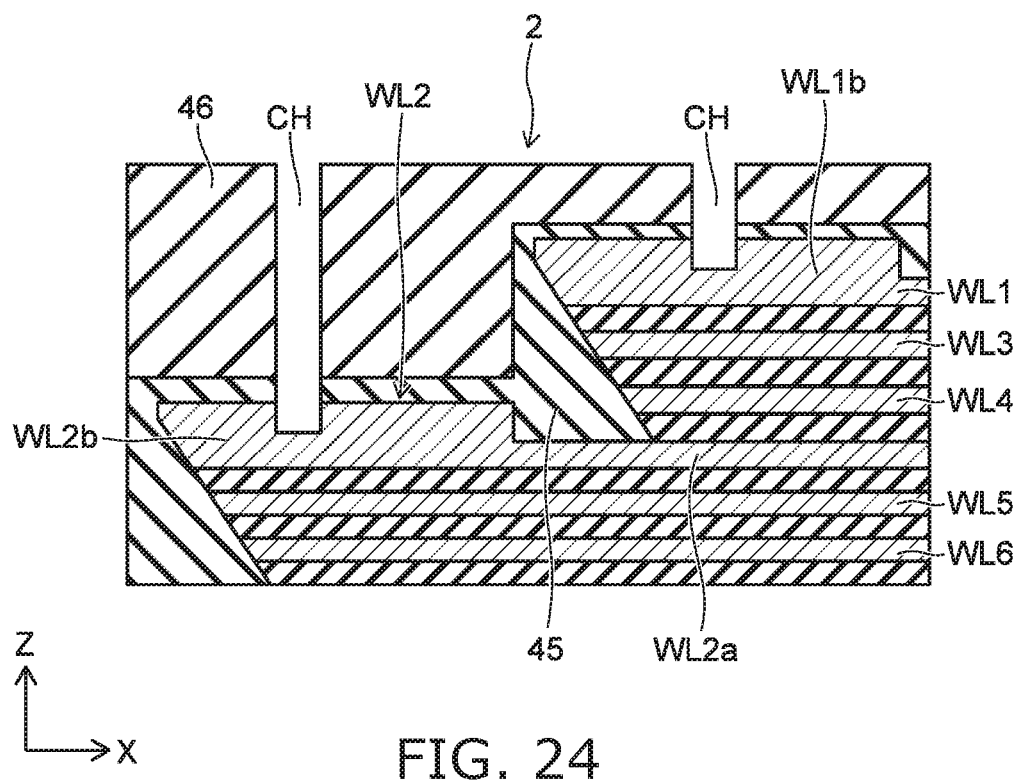

Subsequently, as shown in FIG. 24, contact holes CH that pierce the insulating film 46 and the insulating film 45 and respectively reach the terrace portions WL1b and WL2b are formed.

The multiple contact holes CH are collectively formed by RIE. Because the film thicknesses of the terrace portions WL1b and WL2b are increased, the contact holes CH can be stopped reliably at the terrace portions WL1b and WL2b.

Subsequently, the contact portions CC shown in FIG. 5 are formed by forming a conductive material inside the contact holes CH.

According to the embodiment, the breakdown voltage between the terrace portion WL2b having the increased film thickness and the electrode layers WL3 and WL4 of the other electrode layers WL3 and WL4 proximal to the terrace portion WL2b can be increased because the edges WL3c and WL4c are caused to recede away from the terrace portion WL2b.

The distances between the terrace portion WL2b and the edges WL3c and WL4c of the electrode layers WL3 and WL4 are not increased by reducing the width in the X-direction of the terrace portion WL2b having the increased film thickness. Therefore, the margin of the terrace width can be ensured so that the contact portion CC does not miss the terrace portion WL2b.

The structure of the staircase portion 2 of the multiple electrode layers 70 described above is not limited to the control gates of the memory cells MC and is applicable also to the select gate of the drain-side select transistor STD and the select gate of the source-side select transistor STS.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising a stacked body including a plurality of electrode layers stacked with an insulator interposed,
the plurality of electrode layers including
a plurality of terrace portions arranged along a first direction and a second direction intersecting the first direction, the first direction and the second direction intersecting a stacking direction of the stacked body, the terrace portions not overlapping with an upper electrode layer,
a first electrode layer including a first portion and a second portion thicker than the first portion, the second portion being one of the terrace portions,
a second electrode layer including a third portion and a fourth portion thicker than the third portion, the fourth portion being one of the terrace portions, the fourth portion being provided on a lower level side of the second portion of the first electrode layer, and having a level difference in a staircase configuration between the fourth portion and the second portion, the fourth portion protruding along the first direction further than an edge of the second portion,
a third electrode layer provided between the first electrode layer and the third portion of the second electrode layer, and
a fourth electrode layer provided between the third electrode layer and the third portion of the second electrode layer,
the third electrode layer having an edge receding further than the edge of the second portion of the first electrode layer, the receding being in a reverse direction of a protruding direction of the fourth portion of the second electrode layer, the edge of the third electrode layer being located between the second portion of the first electrode layer and the third portion of the second electrode layer,
the fourth electrode layer having an edge receding in the reverse direction further than the edge of the third electrode layer.

2. The semiconductor device according to claim 1, wherein
the edge of the third electrode layer is a tilted surface, and
a corner between the tilted surface and a lower surface of the third electrode layer recedes in the reverse direction further than a corner between the tilted surface and an upper surface of the third electrode layer.

3. The semiconductor device according to claim 1, wherein
the edge of the fourth electrode layer is a tilted surface, and a corner between the tilted surface and a lower surface of the fourth electrode layer recedes in the reverse direction further than a corner between the tilted surface and an upper surface of the fourth electrode layer.

4. The semiconductor device according to claim 1, wherein
the insulator includes a first insulating layer provided between the third electrode layer and the second portion of the first electrode layer, and
an edge of the first insulating layer recedes in the reverse direction further than the edge of the second portion of the first electrode layer.

5. The semiconductor device according to claim 4, wherein
the insulator further includes a second insulating layer provided between the third electrode layer and the third portion of the second electrode layer, and
an edge of the second insulating layer recedes in the reverse direction further than the edge of the first insulating layer and the edge of the third electrode layer.

6. The semiconductor device according to claim 5, wherein the edge of the first insulating layer, the edge of the third electrode layer, and the edge of the second insulating layer form a tilted surface and are continuous.

7. The semiconductor device according to claim 6, wherein the edge of the second portion of the first electrode layer has a tilted surface continuing from the tilted surface.

8. The semiconductor device according to claim 1, wherein a corner of the second portion of the first electrode layer facing the fourth portion of the second electrode layer has a beveled configuration.

9. The semiconductor device according to claim 1, further comprising:
a first insulating film provided above the second portion of the first electrode layer and above the fourth portion of the second electrode layer; and
contact portions extending through the first insulating film in the stacking direction of the stacked body and being connected respectively to the second portion and the fourth portion.

10. The semiconductor device according to claim 9, further comprising a second insulating film covering the edge of the third electrode layer and being provided between the first insulating film and the edge of the third electrode layer.

11. The semiconductor device according to claim 10, wherein
the plurality of electrode layers further includes a fourth electrode layer provided between the third electrode layer and the third portion of the second electrode layer,
the fourth electrode layer having an edge receding in the reverse direction further than the edge of the third electrode layer,
the second insulating film being provided also between the first insulating film and the edge of the fourth electrode layer, and further covering the edge of the fourth electrode layer.

12. The semiconductor device according to claim 10, wherein the second insulating film is provided also between the first insulating film and an upper surface of the second portion of the first electrode layer, and between the first insulating film and an upper surface of the fourth portion of the second electrode layer.

13. The semiconductor device according to claim 12, wherein the contact portions extend through the first insulating film and the second insulating film in the stacking direction of the stacked body and are connected respectively to the second portion and the fourth portion.

14. The semiconductor device according to claim 1, further comprising:
a semiconductor body extending through the stacked body in the stacking direction of the stacked body; and
a charge storage portion provided between the semiconductor body and one of the electrode layers.

15. A semiconductor device, comprising
a stacked body including a plurality of electrode layers stacked with an insulator interposed;
a first insulating film;
a second insulating film; and
contact portions,
the plurality of electrode layers including
a plurality of terrace portions arranged along a first direction and a second direction intersecting the first direction, the first direction and the second direction intersecting a stacking direction of the stacked body, the terrace portions not overlapping with an upper electrode layer,
a first electrode layer including a first portion and a second portion thicker than the first portion, the second portion being one of the terrace portions,
a second electrode layer including a third portion and a fourth portion thicker than the third portion, the fourth portion being one of the terrace portions, the fourth portion being provided on a lower level side of the second portion of the first electrode layer, and having a level difference in a staircase configuration between the fourth portion and the second portion, the fourth portion protruding along the first direction further than an edge of the second portion, and
a third electrode layer provided between the first electrode layer and the third portion of the second electrode layer,
the third electrode layer having an edge receding further than the edge of the second portion of the first electrode layer, the receding being in a reverse direction of a protruding direction of the fourth portion of the second electrode layer, the edge of the third electrode layer being located between the second portion of the first electrode layer and the third portion of the second electrode layer, wherein
the plurality of electrode layers further includes a fourth electrode layer provided between the third electrode layer and the third portion of the second electrode layer,
the fourth electrode layer having an edge receding in the reverse direction further than the edge of the third electrode layer,
the first insulating film is provided above the second portion of the first electrode layer and above the fourth portion of the second electrode layer,
the contact portions extend through the first insulating film in the stacking direction of the stacked body, and the contact portions are connected respectively to the second portion and the fourth portion,
the second insulating film covers the edge of the third electrode layer, and the second insulating film is provided between the first insulating film and the edge of the third electrode layer,
the second insulating film being provided also between the first insulating film and the edge of the fourth electrode layer, and further covering the edge of the fourth electrode layer.

16. The semiconductor device according to claim 15, wherein the edge of the third electrode layer is a tilted surface, and
a corner between the tilted surface and a lower surface of the third electrode layer recedes in the reverse direction further than a corner between the tilted surface and an upper surface of the third electrode layer.

17. The semiconductor device according to claim 15, wherein
the edge of the fourth electrode layer is a tilted surface, and
a corner between the tilted surface and a lower surface of the fourth electrode layer recedes in the reverse direction further than a corner between the tilted surface and an upper surface of the fourth electrode layer.

18. The semiconductor device according to claim 15, wherein the second insulating film is provided also between the first insulating film and an upper surface of the second portion of the first electrode layer, and between the first insulating film and an upper surface of the fourth portion of the second electrode layer.

19. The semiconductor device according to claim 18, wherein the contact portions extend through the first insulating film and the second insulating film in the stacking direction of the stacked body and are connected respectively to the second portion and the fourth portion.

20. The semiconductor device according to claim 15, further comprising:
a semiconductor body extending through the stacked body in the stacking direction of the stacked body; and
a charge storage portion provided between the semiconductor body and one of the electrode layers.

* * * * *